US009204541B2

(12) United States Patent
Chisaka et al.

(10) Patent No.: US 9,204,541 B2
(45) Date of Patent: Dec. 1, 2015

(54) MULTILAYER CIRCUIT BOARD AND METHOD FOR MANUFACTURING THE SAME

(71) Applicant: MURATA MANUFACTURING CO., LTD., Nagaokakyo-Shi, Kyoto-fu (JP)

(72) Inventors: Shunsuke Chisaka, Nagaokakyo (JP); Hiroshi Somada, Nagaokakyo (JP); Kosuke Nakano, Nagaokakyo (JP); Noboru Kato, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 355 days.

(21) Appl. No.: 13/941,066

(22) Filed: Jul. 12, 2013

(65) Prior Publication Data

US 2013/0299219 A1 Nov. 14, 2013

Related U.S. Application Data

(63) Continuation of application No. PCT/JP2012/053542, filed on Feb. 15, 2012.

(30) Foreign Application Priority Data

| Feb. 15, 2011 | (JP) | 2011-029754 |
|---|---|---|
| Feb. 18, 2011 | (JP) | 2011-033490 |
| Feb. 23, 2011 | (JP) | 2011-037305 |
| Mar. 1, 2011 | (JP) | 2011-043972 |
| Mar. 2, 2011 | (JP) | 2011-045114 |
| Mar. 2, 2011 | (JP) | 2011-045409 |
| Mar. 2, 2011 | (JP) | 2011-045528 |

(51) Int. Cl.
*H05K 1/09* (2006.01)
*H05K 1/02* (2006.01)

(Continued)

(52) U.S. Cl.
CPC .............. *H05K 1/092* (2013.01); *H05K 1/0271* (2013.01); *H05K 1/115* (2013.01); *H05K 1/185* (2013.01);

(Continued)

(58) Field of Classification Search
USPC ......................................................... 174/260
See application file for complete search history.

(56) References Cited

U.S. PATENT DOCUMENTS

| 6,872,465 B2 | 3/2005 | Soga et al. |
|---|---|---|
| 7,214,419 B2 | 5/2007 | Umeda et al. |

(Continued)

FOREIGN PATENT DOCUMENTS

| CN | 1574261 A | 2/2005 |
|---|---|---|
| JP | 08-139424 A | 5/1996 |

(Continued)

OTHER PUBLICATIONS

International Search Report and Written Opinion for PCT/JP2011/053542, date of mailing Apr. 17, 2012.

*Primary Examiner* — William H Mayo, III
*Assistant Examiner* — Krystal Robinson
(74) *Attorney, Agent, or Firm* — Arent Fox LLP

(57) ABSTRACT

The present invention provides a multilayer circuit board that includes a plurality of resin layers, conductive wiring layers, and via-hole conductors. Each of the resin layers includes a resin sheet containing a resin and a conductive wiring layer disposed on at least one surface of the resin sheet. The via-hole conductors contain an intermetallic compound having a melting point of 300° C. or more produced by a reaction between a first metal composed of Sn or an alloy containing 70% by weight or more Sn and a second metal composed of a Cu—Ni alloy or a Cu—Mn alloy. The second metal has a higher melting point than the first metal.

20 Claims, 13 Drawing Sheets

(51) Int. Cl.
- *H05K 1/18* (2006.01)
- *H05K 3/40* (2006.01)
- *H05K 3/46* (2006.01)
- *H05K 1/11* (2006.01)
- *H05K 3/42* (2006.01)
- *H05K 3/00* (2006.01)

(52) U.S. Cl.
CPC ............ *H05K 3/4038* (2013.01); *H05K 3/4069* (2013.01); *H05K 3/429* (2013.01); *H05K 3/4617* (2013.01); *H01L 2224/16225* (2013.01); *H01L 2924/1533* (2013.01); *H05K 3/0052* (2013.01); *H05K 3/4632* (2013.01); *H05K 2201/0305* (2013.01); *H05K 2201/096* (2013.01); *H05K 2201/09527* (2013.01); *H05K 2201/09781* (2013.01); *H05K 2201/10636* (2013.01); *H05K 2203/0554* (2013.01); *H05K 2203/063* (2013.01); *Y10T 29/49165* (2015.01)

(56) References Cited

U.S. PATENT DOCUMENTS

| | | |
|---|---|---|
| 8,388,724 B2 | 3/2013 | Kato et al. |
| 2003/0224197 A1 | 12/2003 | Soga et al. |
| 2004/0238603 A1* | 12/2004 | Saito ..................... 228/180.22 |
| 2005/0029666 A1 | 2/2005 | Kurihara et al. |
| 2006/0057340 A1 | 3/2006 | Umeda et al. |
| 2009/0220812 A1 | 9/2009 | Kato et al. |
| 2012/0156512 A1* | 6/2012 | Nakano et al. ............. 428/457 |

FOREIGN PATENT DOCUMENTS

| | | |
|---|---|---|
| JP | 2000-323806 A | 11/2000 |
| JP | 2001-267486 A | 9/2001 |
| JP | 2002-254194 A | 9/2002 |
| JP | 2002-290052 A | 10/2002 |
| JP | 2002-319763 A | 10/2002 |
| JP | 2003-100146 A | 4/2003 |
| JP | 2003-249765 A | 9/2003 |
| JP | 2003-260587 A | 9/2003 |
| JP | 2005-045187 A | 2/2005 |
| JP | 2006-049434 A | 2/2006 |
| JP | 2006-121147 A | 5/2006 |
| JP | 2008-071842 A | 3/2008 |
| JP | 2010-074151 A | 4/2010 |
| JP | 2010-103559 A | 5/2010 |
| WO | WO-03/021664 A1 | 3/2003 |
| WO | WO-03/105160 A1 | 12/2003 |
| WO | WO-2007/125861 A1 | 11/2007 |

* cited by examiner

PRIOR ART

REGION FOR WIRING

MULTILAYER CIRCUIT BOARD AND METHOD FOR MANUFACTURING THE SAME

CROSS REFERENCE TO RELATED APPLICATIONS

The present application is a continuation of PCT/JP2012/053542 filed Feb. 15, 2012, which claims priority to Japanese Patent Application No. 2011-029754, filed Feb. 15, 2011, Japanese Patent Application No. 2011-033490, filed Feb. 18, 2011, Japanese Patent Application No. 2011-037305, filed Feb. 23, 2011, Japanese Patent Application No. 2011-043972, filed Mar. 1, 2011, Japanese Patent Application No. 2011-045114, filed Mar. 2, 2011, Japanese Patent Application No. 2011-045409, filed Mar. 2, 2011, and Japanese Patent Application No. 2011-045528, filed Mar. 2, 2011, the entire contents of each of which are incorporated herein by reference.

FIELD OF THE INVENTION

The present invention relates to a multilayer circuit board manufactured by stacking a plurality of resin layers, each of which includes a resin sheet and a conductive wiring layer disposed on the resin sheet.

BACKGROUND OF THE INVENTION

In recent years, resin multilayer circuit boards have been applied to packages including a circuit board or a semiconductor element. A resin multilayer circuit board includes a plurality of resin layers, each of which includes a conductive wiring layer on a surface of a resin sheet containing a resin. With increasing number of wiring layers, different conductive wiring layers are sometimes electrically connected to each other through a via-hole conductor. In general, such a via-hole conductor is formed by boring a via-hole (through-hole) in a resin sheet at a predetermined position and plating the inner wall of the via-hole.

However, such a method disadvantageously requires an expensive chemical in chemical plating and a long treatment time. Furthermore, it is difficult to form a via-hole conductor between intended layers in the manufacture of a multilayer circuit board. Thus, the density of the conductive wiring layers cannot be sufficiently increased.

In view of the situations described above, according to a recent method, a low-viscosity electroconductive paste containing a metal powder and an organic component filled in a via-hole is solidified to form a via-hole conductor. A known electroconductive paste for use in the formation of a via-hole conductor may be an electroconductive paste containing a metal component (lead-free solder) mainly composed of Cu or Ag, Sn, and Bi and an organic component (flux component) or a contact-type electroconductive paste containing Ag or Cu and an organic component.

For example, Patent Document 1 (Japanese Unexamined Patent Application Publication No. 2002-290052) discloses a method for filling a via-hole with an electroconductive paste by screen printing to form a via-hole conductor for a multilayer circuit board. The electroconductive paste contains an electroconductive metal component containing Cu, Sn, and Bi in a predetermined ratio and an organic component.

However, because of a low diffusion velocity of Sn in a reaction between Ag or Cu and Sn, complete alloying of Sn takes a long time. Thus, a short heat treatment results in the presence of unreacted Sn (low-melting-point metal) in a via-hole conductor and consequently low heat resistance of the via-hole conductor.

A known method for manufacturing a semiconductor device for die-bonding a chip or a semiconductor device for flip chip bonding is a temperature hierarchy connection method in which connection using a high-melting-point solder in a semiconductor device is followed by the connection of the semiconductor device to a substrate with a low melting point solder. The semiconductor device is soldered at a lower temperature than the melting point of the solder within the semiconductor device. Thus, the semiconductor device can be connected to the substrate without melting the solder within the semiconductor device.

As a high-melting-point solder for use in such a temperature hierarchy connection method, Patent Document 2 (Japanese Unexamined Patent Application Publication No. 2002-254194) discloses a solder paste that contains a low-melting-point metal Sn or In ball and a high-melting-point metal Cu, Al, Au, or Ag ball. As illustrated in FIG. 4(a), the solder paste disclosed in Patent Document 2 contains low-melting-point metal balls 91, high-melting-point metal balls 92, and a flux component. During heat treatment, a low-melting-point metal of the low-melting-point metal balls reacts with a high-melting-point metal of the high-melting-point metal balls to form a high-melting-point intermetallic compound. After heat treatment, as illustrated in FIG. 4(b), a plurality of high-melting-point metal balls 92 are linked together through the intermetallic compound 93. This heat-resistant linkage allows conductive wiring layers to be connected to each other.

However, in a reaction between a high-melting-point metal, such as Cu, and a low-melting-point metal, such as Sn, complete alloying of the low-melting-point metal takes a long time because of a low diffusion velocity of the low-melting-point metal. Thus, a short heat treatment results in the presence of a residual low-melting-point metal, such as Sn. In the formation of a via-hole conductor using such a known electroconductive paste (solder paste), therefore, the via-hole conductor has insufficient heat resistance because of residual Sn.

Even with such a known electroconductive paste, a long heat treatment at a high temperature can completely eliminate Sn from the via-hole conductor. However, such a heat treatment may cause the resin of the resin sheet to flow out and result in low productivity. Thus, such a heat treatment is undesirable from a practical standpoint.

Patent Document 1: Japanese Unexamined Patent Application Publication No. 2002-290052

Patent Document 2: Japanese Unexamined Patent Application Publication No. 2002-254194

SUMMARY OF THE INVENTION

In view of the problems described above, it is an object of the present invention to provide a multilayer circuit board that includes a heat-resistant via-hole conductor and a method for manufacturing the multilayer circuit board.

The present invention provides a multilayer circuit board that includes a plurality of resin layers, conductive wiring layers, and via-hole conductors. Each of the resin layers includes a resin sheet containing a resin and a conductive wiring layer disposed on at least one surface of the resin sheet. The via-hole conductors contain an intermetallic compound having a melting point of 300° C. or more produced by a reaction between a first metal composed of Sn or an alloy containing 70% by weight or more Sn and a second metal composed of a Cu—Ni alloy or a Cu—Mn alloy. The second metal has a higher melting point than the first metal.

The resin preferably contains a thermoplastic resin. The second metal preferably constitutes 30% by weight or more of the metal component. It is also preferable that Ni constitutes 10% to 15% by weight of the Cu—Ni alloy, and Mn constitutes 10% to 15% by weight of the Cu—Mn alloy.

In the multilayer circuit board, the resin sheet preferably includes via-hole conductors for electrically connecting the conductive wiring layers to each other.

In the multilayer circuit board, the resin sheet preferably includes via-hole conductors for electrically connecting the conductive wiring layers to each other, and the multilayer circuit board preferably includes an electronic component having an external electrode.

In the multilayer circuit board, the external electrode preferably contains Sn on its surface. In the multilayer circuit board, the resin sheet preferably further includes a protective via-hole conductor electrically insulated from the conductive wiring layers. The protective via-hole conductor preferably contains an intermetallic compound having a melting point of 300° C. or more produced by a reaction between a first metal composed of Sn or an alloy containing 70% by weight or more Sn and a second metal composed of a Cu—Ni alloy or a Cu—Mn alloy. The second metal has a higher melting point than the first metal.

In the multilayer circuit board, the resin sheet preferably includes via-hole conductors for electrically connecting the conductive wiring layers to each other, and at least one surface of the multilayer circuit board preferably includes a plurality of connection terminals for connecting the conductive wiring layers to an electrode of an electronic component of the multilayer circuit board.

In the multilayer circuit board, the connection terminals preferably contain an intermetallic compound having a melting point of 300° C. or more produced by a reaction between a first metal composed of Sn or an alloy containing 70% by weight or more Sn and a second metal composed of a Cu—Ni alloy or a Cu—Mn alloy. The second metal has a higher melting point than the first metal.

In the multilayer circuit board, the resin sheet preferably includes via-hole conductors for electrically connecting the conductive wiring layers to each other, and the multilayer circuit board preferably has a cavity and an electronic component disposed in the cavity. Part of the conductive wiring layers function as heat radiation patterns for radiating heat generated by the electronic component. Part of the via-hole conductors function as thermal vias for connecting the electronic component to the conductive wiring layers functioning as the heat radiation patterns.

The surfaces of the conductive wiring layers in contact with the via-hole conductors are preferably partly or entirely roughened.

In the multilayer circuit board, the resin sheet preferably includes via-hole conductors for electrically connecting the conductive wiring layers to each other. At least part of the via-hole conductors in the resin sheet are preferably directly connected to via-hole conductors in an adjacent resin sheet without through a via-receiving conductor pattern.

In the multilayer circuit board, the multilayer circuit board is preferably manufactured by cutting a multilayer composite board that includes a plurality of resin layers. Each of the resin layers includes a resin sheet containing a resin and a conductive wiring layer disposed on at least one surface of the resin sheet. The multilayer composite board preferably includes a via-hole conductor electrically connected to the conductive wiring layer such that the via-hole conductor can be cut simultaneously with cutting of the multilayer composite board. An external electrode formed by cutting the via-hole conductor simultaneously with cutting of the multilayer composite board is preferably disposed on the cross-section of the multilayer circuit board.

Each of the conductive wiring layers preferably has a rough surface in contact with the resin sheet in the corresponding resin layer.

In the multilayer circuit board, the via-hole conductors are preferably formed in the resin sheet by a conformal laser processing method.

The present invention also relates to a method for manufacturing the multilayer circuit board that includes forming a via-hole at a predetermined position in a resin layer that includes a resin sheet containing a resin and a conductive wiring layer disposed on at least one surface of the resin sheet and filling the via-hole with an electroconductive paste, and stacking a plurality of the resin layers including the electroconductive paste, press-bonding the resin layers at the same time in heat treatment, and simultaneously forming a via-hole conductor out of the electroconductive paste to electrically connect the conductive wiring layers to each other.

The electroconductive paste contains a metal component and a flux component. The metal component containing a first metal powder composed of a metal in which Sn constitutes 70% by weight or more and a second metal powder composed of a Cu—Ni alloy or a Cu—Mn alloy. The second metal powder has a higher melting point than the first metal.

The present invention can provide a multilayer circuit board including a via-hole conductor having higher heat resistance than before, and a method for manufacturing the multilayer circuit board. The multilayer circuit board has high electrical conductivity and connection reliability.

In accordance with a method for manufacturing a multilayer circuit board according to the present invention, use of an electroconductive paste having the composition described above simultaneously allows the low-melting-point component (for example, Sn having a melting point of 232° C.) in the electroconductive paste within the via-hole to be entirely converted into a high-melting-point intermetallic compound through a reaction with a high-melting-point component (a Cu—Ni alloy or a Cu—Mn alloy having a melting point of approximately 1000° C.) in a short period of time (for example, several seconds to several minutes) and further allows diffusion bonding with an electrode metal (for example, Cu) when the resin layers is bonded by pressure. Thus, the via-hole conductor is composed of any of intermetallic compounds having a substantially high melting point (for example, $Cu_2NiSn$, $Cu_2MnSn$, a Ni-Sn intermetallic compound, a Mn—Sn intermetallic compound, and a Sn—Cu intermetallic compound having a melting point of 300° C. or more) and the high-melting-point components (such as a Cu—Ni alloy) and has high heat resistance.

BRIEF DESCRIPTION OF THE DRAWINGS

FIG. 1(a) is a schematic view of a state before heating. FIG. 1(b) is a schematic view illustrating the melting of a first metal after the start of heating. FIG. 1(c) is a schematic view illustrating that substantially all the first metal forms an intermetallic compound with a second metal while heating is continued.

FIG. 4(a) illustrates a state before heating. FIG. 4(b) illustrates a state after soldering.

DETAILED DESCRIPTION OF THE PREFERRED EMBODIMENTS OF THE INVENTION

Multilayer Circuit Board

Figure 1:
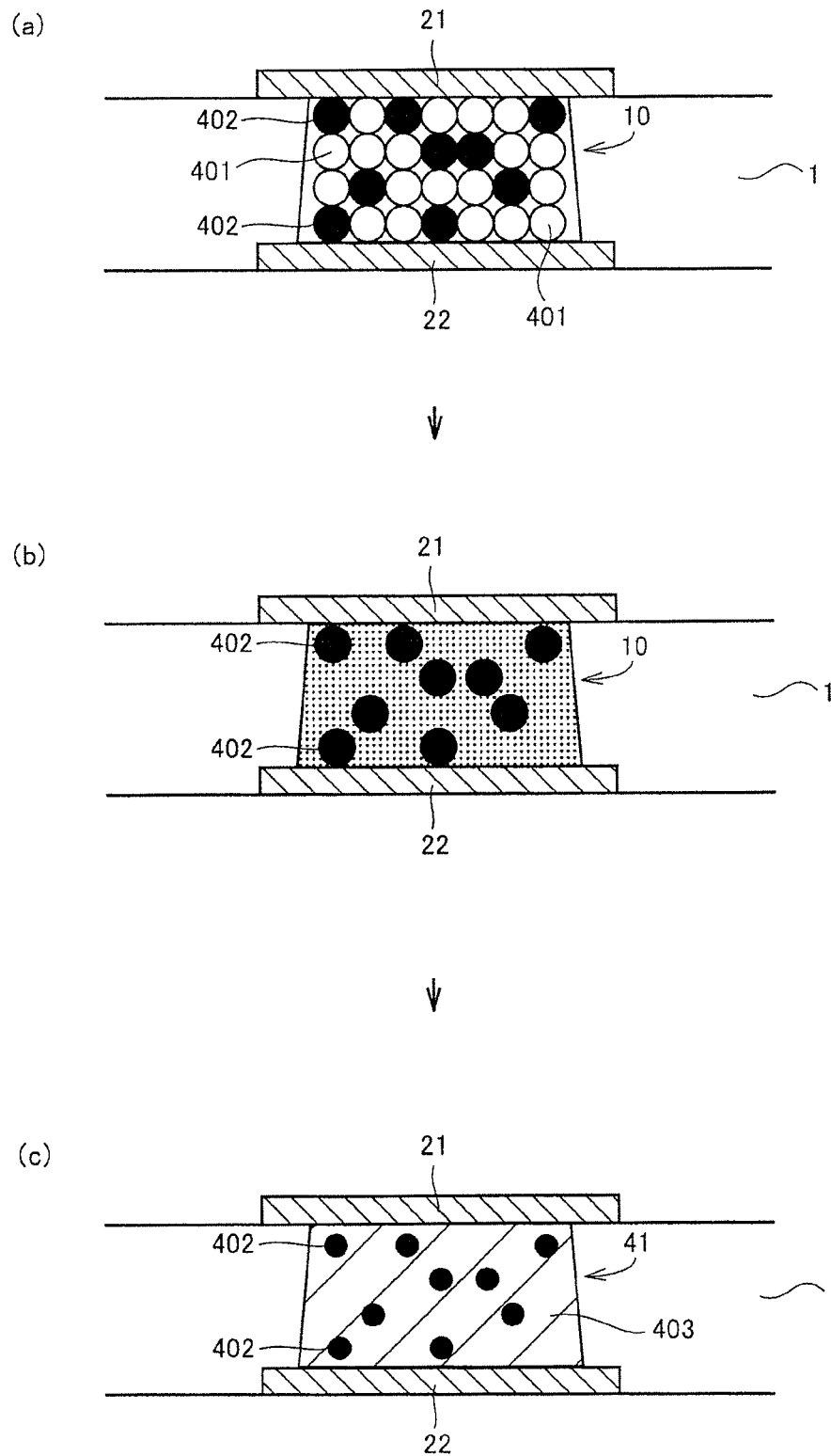
FIGS. 1(a) to 1(c) illustrate schematic views of the behavior of a metal component in the formation of a via-hole conductor by a method for manufacturing a multilayer circuit board according to an embodiment of the present invention.

A multilayer circuit board according to an embodiment of the present invention includes a plurality of resin layers, conductive wiring layers, and via-hole conductors. Each of the resin layers includes a resin sheet containing a resin and a conductive wiring layer disposed on at least one surface of the resin sheet. The via-hole conductors contain an intermetallic compound having a melting point of 300° C. or more produced by a reaction between a first metal composed of Sn or an alloy containing 70% by weight or more Sn and a second metal composed of a Cu—Ni alloy or a Cu—Mn alloy. The second metal has a higher melting point than the first metal. The components of the multilayer circuit board will be described in detail below.

Resin Sheet

In the present invention, the resin sheet may be any plate- or film-like resin sheet made of an electrically insulating material. The resin preferably contains a thermoplastic resin. Examples of the thermoplastic resin include polyimide, liquid crystal polymers (LCPs), polyetherketone resin (PEEK), and polyphenylene sulfide resin (PPS). The resin sheet is not limited to a resin sheet containing a thermoplastic resin and may be a thermosetting resin (polyimide: PI) sheet coated with an adhesive in advance.

Conductive Wiring Layer

The conductive wiring layer may be one of conductive wiring layers used in known circuit boards. The material of the conductive wiring layer may be copper, silver, aluminum, SUS, nickel, gold, or an alloy thereof, preferably copper. The conductive wiring layer is preferably made of conductive foil.

Via-Hole Conductor

A via-hole conductor in a multilayer circuit board according to an embodiment of the present invention contains an intermetallic compound having a melting point of 300° C. or more produced by a reaction between a first metal Sn or an alloy containing 70% by weight or more Sn and a second metal (Cu—Ni alloy or Cu—Mn alloy). The second metal has a higher melting point than the first metal.

The first metal is Sn or an alloy containing 70% by weight or more Sn. More specifically, the first metal is a metal composed of Sn alone or an alloy containing 70% by weight or more Sn. The alloy containing 70% by weight or more Sn may be an alloy containing 70% by weight or more Sn and at least one selected from the group consisting of Cu, Ni, Ag, Au, Sb, Zn, Bi, In, Ge, Al, Co, Mn, Fe, Cr, Mg, Mn, Pd, Si, Sr, Te and P. The alloy can supply a sufficient amount of Sn, which is a reactive component for the second metal (Cu—Ni alloy or Cu—Mn alloy) and is necessary for the production of a desired intermetallic compound (such as $Cu_2NiSn$, $Cu_2MnSn$, a Ni-Sn intermetallic compound, a Mn—Sn intermetallic compound, or a Sn—Cu intermetallic compound). When the Sn content of the first metal is less than 70% by weight, a desired amount of intermetallic compound cannot be produced because of a deficiency of Sn, and heat-resistant via-hole conductors cannot be produced. In the case that the first metal is an alloy, Sn preferably constitutes 85% by weight or more of the alloy so as to produce the effects described above.

The second metal is a Cu—Ni alloy or a Cu—Mn alloy having a higher melting point than the first metal. The Cu—Ni alloy may be Cu-10Ni, and the Cu—Mn alloy may be Cu-10Mn. The number 10 in "Cu-10Ni", as used herein, refers to the weight percentage of the corresponding component (Ni in this case). The same applies hereinafter.

Ni preferably constitutes 10% to 15% by weight of the Cu—Ni alloy. Mn preferably constitutes 10% to 15% by weight of the Cu—Mn alloy. This allows Ni or Mn to be sufficiently supplied in the production of a desired intermetallic compound. When Ni or Mn constitutes less than 10% by weight of the Cu—Ni alloy or the Cu—Mn alloy, Sn in the first metal may partly remain without forming an intermetallic compound. When Ni or Mn constitutes more than 15% by weight of the Cu—Ni alloy or the Cu—Mn alloy, Sn in the first metal may also partly remain without forming an intermetallic compound.

An intermetallic compound produced by a reaction between the first metal and the second metal preferably contains $Cu_2NiSn$ or $Cu_2MnSn$. A multilayer circuit board including via-hole conductors formed of such an intermetallic compound having a melting point of 300° C. or more has high heat resistance.

The second metal is such a Cu—Ni alloy or a Cu—Mn alloy that a difference in lattice constant between the second metal and the intermetallic compound initially produced on the surface of the second metal is 50% or more of the lattice constant of the second metal.

The term "intermetallic compound initially produced on the surface of the second metal", as used herein, refers to an intermetallic compound first produced on the surface of the second metal after the start of heat treatment and is usually a ternary alloy of metals constituting the first metal and the second metal (for example, $Cu_2NiSn$ or $Cu_2MnSn$), preferably a Cu—Ni-Sn alloy or a Cu—Mn—Sn alloy.

The phrase "a difference in lattice constant between the second metal and the intermetallic compound initially produced on the surface of the second metal", as used herein, refers to the absolute value calculated by subtraction of the lattice constant (the length of the crystallographic axis) of the second metal component from the lattice constant (the length of the crystallographic axis) of the intermetallic compound initially produced on the surface of the second metal. Thus, the difference in lattice constant indicates the difference between the lattice constant of the intermetallic compound newly formed on the second metal and the lattice constant of the second metal. It is not a question which has a higher lattice constant. In general, the intermetallic compound has a higher lattice constant than the second metal component.

When the difference between the lattice constant of the intermetallic compound initially produced on the surface of the second metal and the lattice constant of the second metal is a certain level or more, the reaction between the first metal and the second metal to produce the intermetallic compound can be promoted, and the intermetallic compound can be produced by a short heat treatment at a relatively low temperature. Thus, the first metal having a low melting point in a via-hole conductor is rapidly converted into a high-melting-point intermetallic compound, thereby forming a heat-resistant via-hole conductor. When the difference in lattice constant between the second metal and the intermetallic compound initially formed on the surface of the second metal is less than 50% of the lattice constant of the second metal, use of such first and second metals cannot produce these effects. Such via-hole conductor also has high strength and excellent absorption of external stress.

Method for Manufacturing Multilayer Circuit Board

An example of a method for manufacturing a multilayer circuit board according to the present invention will be described below. A method for manufacturing a multilayer circuit board described below includes:

(1) forming a via-hole at a predetermined position in a resin layer that includes a resin sheet containing a thermoplastic resin and a conductive wiring layer disposed on at least one surface of the resin sheet and filling the via-hole with an electroconductive paste; and (2) stacking a plurality of the resin layers including the electroconductive paste, press-bonding the resin layers at the same time in heat treatment, and simultaneously forming a via-hole conductor out of the electroconductive paste to electrically connect the conductive wiring layers to each other.

Resin Sheet

The resin sheet may be an insulating resin sheet containing the resin described above. The resin of the resin sheet may flow during heat treatment. Thus, it is desirable that heat treatment in pressing described below be performed at relatively low temperature. In particular, when the resin is a thermoplastic resin, which is highly likely to flow during heat treatment, it is desirable that heat treatment be performed at a relatively low temperature.

Formation of Conductive Wiring Layer

First, a conductive wiring layer is formed on at least one surface of the resin sheet. The conductive wiring layer may be formed using one of various known methods. For example, after a conductive foil is bonded to a surface of the resin sheet or is placed on a surface of the resin sheet without using an adhesive, the conductive foil may be etched to form a wiring circuit. Alternatively, a conductive foil formed into the shape of a wiring circuit may be transferred to the resin sheet. Alternatively, a circuit may be formed on a surface of the resin sheet by metal plating.

The material of the conductive foil for use in the formation of the conductive wiring layer may be copper, silver, aluminum, SUS, nickel, gold, or an alloy thereof, preferably copper. The conductive foil may have any thickness, provided that a circuit can be formed, and may be in the range of approximately 3 to 40 μm.

The conductive foil may be roughened on its surface so as to improve its adhesion to a thermoplastic resin sheet. The roughness (Rz) of the rough surface may be in the range of 1 to 15 μm. Directly placing a conductive foil having a rough surface on the resin sheet without using an adhesive is advantageous in that the bonding of resin sheets in one-time press bonding described below is not inhibited. Furthermore, the conductive foil can bite into the resin sheet, which enhances the bonding between the conductive foil and the resin sheet.

A conductive wiring layer, such as a connection pad and a circuit wiring layer, is then formed on one surface of the resin sheet by a known circuit forming method, such as photolithography.

In a via-hole having a truncated cone shape, the diameter of a surface on which a conductive wiring layer is formed is generally smaller than the diameter of the opposite surface.

Formation of Via-Hole

A via-hole is then formed at a predetermined position in a resin layer having a conductive wiring layer at which a via-hole conductor is to be formed. The via-hole may be bored using carbon dioxide laser radiation in the resin layer from a surface opposite the surface on which the conductive wiring layer has been formed. If necessary, residual smears (resin residues) in the via-hole formed through laser processing are removed by general-purpose chemical solution treatment.

Filling with Electroconductive Paste

The opening (via-hole) thus formed is then filled with an electroconductive paste by screen printing or vacuum filling. The electroconductive paste (via paste) may be prepared by blending a metal component composed of the first metal and the second metal with a flux component. The components of the electroconductive paste will be further described below.

Metal Component

The metal component may be the first metal, the second metal, and the like. More specifically, the metal component in the electroconductive paste may be a powder of the first metal (first metal powder) and a powder of the second metal (second metal powder) dispersed in the paste.

The arithmetic mean particle size of the first metal powder and the second metal powder is preferably in the range of 3 to 10 μm. An excessively small arithmetic mean particle size results in high manufacturing costs. This also accelerates the oxidation of the metal powders and tends to inhibit the reaction. Excessively large particles cannot be charged into a via-hole. In consideration of the connection and reaction between the first metal and the second metal, the oxygen concentration of the first metal powder and the second metal powder is preferably 2000 ppm or less, more preferably in the range of 10 to 1000 ppm.

The second metal in the electroconductive paste preferably constitutes 30% by weight or more of the metal component (the first metal constitutes less than 70% by weight of the metal component). This can decrease the percentage of residual Sn in a via-hole conductor and increase the percentage of an intermetallic compound produced by a reaction between the first metal and the second metal, thus further improving the electrical conductivity, heat resistance, strength, and absorption of external stress of the via-hole conductor.

When the first metal powder and the second metal powder have a specific surface area of 0.05 $m^2/g^{-1}$ or more, this results in an increase in the probability of contact between the first metal powder and the second metal powder and further facilitates the formation of an intermetallic compound between the first metal and the second metal. This can result in an increased melting point in a common reflow profile.

The second metal powder may be coated with at least part of the first metal powder. This can facilitate the formation of an intermetallic compound between the first metal and the second metal and make the present invention more effective.

Use of a Cu—Mn alloy or a Cu—Ni alloy and moreover a Cu—Mn alloy containing 10% to 15% by weight Mn or a Cu—Ni alloy containing 10% to 15% by weight Ni as the second metal can facilitate the formation, of an intermetallic compound between the first metal and the second metal at a lower temperature in a shorter period of time and prevent melting in the subsequent reflow process.

The second metal may contain impurities, for example, in an amount of 1% by weight or less of the second metal, provided that the impurities do not inhibit the reaction between the first metal and the second metal. Examples of the impurities include Zn, Ge, Ti, Sn, Al, Be, Sb, In, Ga, Si, Ag, Mg, La, P, Pr, Th, Zr, B, Pd, Pt, Ni, and Au.

The metal component preferably constitutes 85% to 95% by weight of the electroconductive paste. When the metal component constitutes more than 95% by weight of the electroconductive paste, it is difficult to produce a low-viscosity electroconductive paste that is easy to charge. When the metal component constitutes less than 85% by weight (the flux component constitutes more than 15% by weight) of the electroconductive paste, the flux component tends to remain in a via-hole conductor and cause a problem with electrical conductivity or thermal conductivity of the via-hole conductor.

Flux Component

The flux component may be one of various known flux components used as materials of electroconductive pastes and contains a resin. Examples of the components other than the resin include vehicles, solvents, thixotropic agents, and activators.

Preferably, the resin may be at least one thermosetting resin selected from the group consisting of epoxy resin, phenolic resin, polyimide resin, silicone resin, modified silicone resin, and acrylic resin, or may be at least one thermoplastic resin selected from the group consisting of polyamide resin, polystyrene resin, polymethacrylate resin, polycarbonate resin, and cellulose resin.

Examples of the vehicles include rosin resin, such as rosin and rosin derivatives, including modified rosin, synthetic resin, and mixtures thereof. Examples of rosin resin, such as rosin and rosin derivatives, including modified rosin, include gum rosin, tall oil rosin, wood rosin, polymerized rosin, hydrogenated rosin, formylated rosin, rosin ester, rosin-modified maleic acid resin, rosin-modified phenolic resin, rosin-modified alkyd resin, and various rosin derivatives. Examples of the synthetic resin include polyester resin, polyamide resin, phenoxy resin, and terpene resin.

Examples of the solvents include alcohols, ketones, esters, ethers, aromatics, and hydrocarbons. Specific examples of the solvents include benzyl alcohol, ethanol, isopropyl alcohol, butanol, diethylene glycol, ethylene glycol, glycerin, ethyl cellosolve, butyl cellosolve, ethyl acetate, butyl acetate, butyl benzoate, diethyl adipate, dodecane, tetradecene, α-terpineol, terpineol, 2-methyl 2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexanedimethanol, 2-terpinyloxyethanol, 2-dihydroterpinyloxyethanol, and mixtures thereof. The solvents are preferably terpineol, ethylene glycol monobutyl ether, diethylene glycol monoethyl ether, and diethylene glycol monobutyl ether.

Specific examples of the thixotropic agents include hydrogenated castor oil, carnauba wax, amides, hydroxy fatty acids, dibenzylidene sorbitol, bis(p-methylbenzylidene)sorbitol, beeswax, stearamide, and hydroxystearic acid ethylenebisamide. If necessary, the thixotropic agents may further contain a fatty acid, such as caprylic acid, lauric acid, myristic acid, palmitic acid, stearic acid, or behenic acid, a hydroxy fatty acid, such as 1,2-hydroxystearic acid, an antioxidant, a surfactant, or an amine.

Examples of the activators include amine hydrohalides, organic halides, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organic halides include paraffin chlorides, tetrabromoethane, dibromopropanol, 2,3-dibromo-1,4-butanediol, 2,3-dibromo-2-butene-1,4-diol, and tris(2,3-dibromopropyl)isocyanurate.

Examples of the organic acids include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amines include monoethanolamine, diethanolamine, triethanolamine, tributylamine, aniline, and diethylaniline.

Examples of the polyhydric alcohols include erythritol, pyrogallol, and ribitol.

Stacking and One-Time Press Bonding of Resin Layers Having Filled Vias

A plurality of resin layers including a via paste thus formed are stacked and press-bonded at the same time in heat treatment. The heat treatment temperature is preferably 230° C. or more at least for a predetermined period of time. When the treatment temperature does not reach 230° C., Sn (melting point: 232° C.) in the first metal does not melt and cannot form an intermetallic compound. The maximum temperature of the heat treatment is preferably 300° C. or less. When the maximum temperature of the heat treatment exceeds 300° C., and the resin sheet contains a liquid crystal polymer (LCP) as the resin, the resin may flow out. Although the flow temperature of the resin (LCP) at a pressure of 0 Pa depends on its molecular weight, the resin starts to flow at a temperature of approximately 315° C.

Heat treatment during press bonding causes the flux component in the via paste to be decomposed and volatilize simultaneously with the bonding between the resin layers. Sn in the first metal reacts with the second metal (such as Cu—Ni or Cu—Mn) to form an intermetallic compound. At an interface between a conductive wiring layer and a via-hole conductor, a metal of the conductive wiring layer reacts with the first metal of the via-hole conductor to form an alloy layer.

An example of suitable heat treatment may be a two-stage heat treatment in which the solvent of the flux component is volatilized by heat treatment at a temperature in the range of approximately 150° C. to 230° C. (for example, 200° C.) while substantially no pressure is applied to stacked resin layers, and the stacked resin layers are then heated to a temperature in the range of approximately 280° C. to 300° C. (for example, 290° C.) while a pressure in the range of approximately 1 to 10 MPa (for example, 4 MPa) is applied to both sides of the stacked resin layers. When the stacked resin layers are heated to a temperature in the range of approximately 280° C. to 300° C., the resin of the resin sheets is softened, and the resin sheets are bonded together. Simultaneously, the flux component other than the solvent in the via paste is decomposed and volatilizes. Sn in the first metal reacts with the second metal to form an intermetallic compound, thereby forming a via-hole conductor. Since substantially all the flux component in the electroconductive paste volatilizes, there is substantially no organic component in the via-hole conductor.

The resin layers including the electroconductive paste are stacked and press-bonded at the same time in heat treatment. Simultaneously, a via-hole conductor can be formed out of the electroconductive paste to electrically connect the conductive wiring layers. In the case that a multilayer circuit board includes an electronic component, a conductive wiring layer may be electrically connected to an external electrode of the electronic component.

Behavior of Metal Component in Formation of Via-Hole Conductor

FIG. 1 schematically illustrates the behavior of a metal component in the formation of a via-hole conductor by a method for manufacturing a multilayer circuit board according to an embodiment of the present invention.

FIG. 1(a) illustrates a resin layer in which a pair of conductive wiring layers (wiring) 21 and 22 are disposed on the surfaces of the resin sheet 1, which constitutes a multilayer circuit board. A via-hole 10 is bored in the resin sheet 1 from a surface opposite the surface on which the conductive wiring layer (wiring) 21 is formed, and is filled with an electroconductive paste containing a first metal 401 and a second metal 402. The resin layer is placed on another resin layer (not shown) such that a surface of the other resin layer on which the conductive wiring layer (wiring) 22 is formed faces a surface of the resin layer opposite the surface of the resin sheet 1 on which the conductive wiring layer 21 is formed. The via-hole 10 disposed between a pair of wiring layers 21 and 22 is filled with an electroconductive paste containing the first metal 401 and the second metal 402.

A plurality of resin layers having such a structure are heated. When the temperature of the electroconductive paste filled in the via-hole 10 reaches the melting point of the first metal 401 or more, the first metal 401 melts, as illustrated in FIG. 1(b).

While heating is continued, the first metal 401 reacts with the second metal 402 to form an intermetallic compound 403 (FIG. 1(c)). In an electroconductive paste for use in the present invention, because of a large difference in lattice constant between the second metal 402 and the intermetallic compound 403 formed at the interface between the first metal 401 and the second metal 402, the intermetallic compound is repeatedly detached and dispersed in the first metal during the reaction. This can dramatically promote the formation of the intermetallic compound and rapidly decrease the amount of first metal 401 (FIGS. 1(a) and 1(b)). Furthermore, the ratio of the first metal 401 to the second metal 402 can be optimized so as to convert substantially all the first metal 401 into the intermetallic compound 403, as illustrated in FIG. 1(c). Thus, a heat-resistant via-hole conductor can be formed.

Such via-hole conductors (including those used as thermal vias) have excellent electrical conductivity and heat radiation performance. As described above, because of dramatic progress in the formation of an intermetallic compound, an external electrode having high heat resistance and bonding reliability can be formed by a short heat treatment at a relatively low temperature at which the resin of the resin sheet does not flow out.

Embodiment 1

A multilayer circuit board according to the present embodiment includes a via-hole conductor for electrically connecting conductive wiring layers in a resin layer.

A method for manufacturing a multilayer circuit board according to an embodiment of the present invention will be described below with reference to FIGS. 2 and 3.

Figure 2:
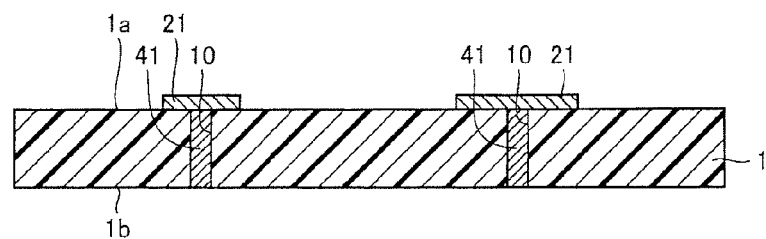
FIG. 2 is a cross-sectional view illustrating a method for manufacturing a multilayer circuit board according to an embodiment of the present invention.

Referring to FIG. 2, a via-hole 10 is formed from the back side (surface 1b) of a resin sheet to a conductive wiring layer 21. The via-hole 10 is formed through laser processing using a carbon dioxide laser or the like at each location at which an inner via (via-hole conductor) is to be formed. After boring a hole in the resin sheet, smears of resin residues are removed.

The via-hole 10 is then filled with an electroconductive paste, for example, by screen printing to form a via-hole conductor 41. The electroconductive paste produces an intermetallic compound having a melting point of 300° C. or more by a reaction between the first metal and the second metal.

Figure 3:
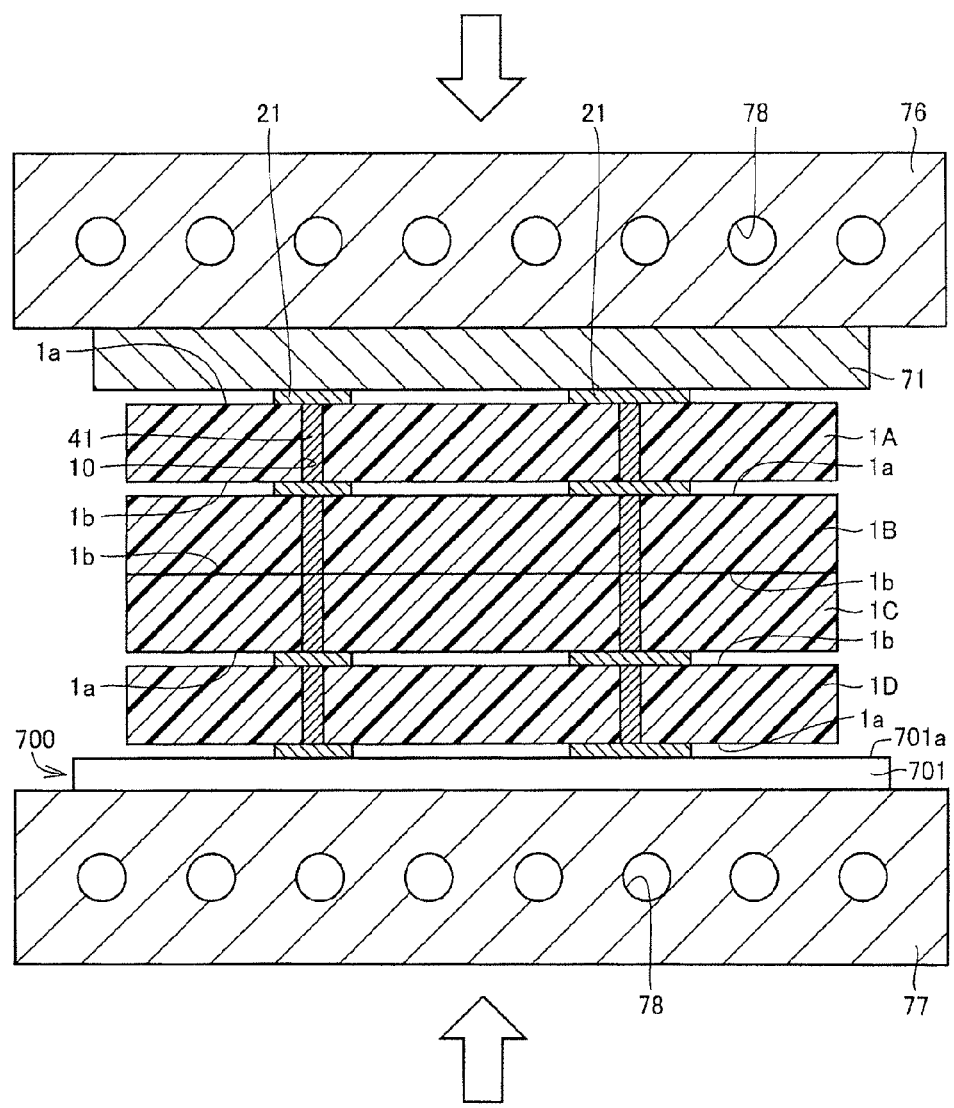
FIG. 3 is another cross-sectional view illustrating a method for manufacturing a multilayer circuit board according to an embodiment of the present invention.
Figure 4:
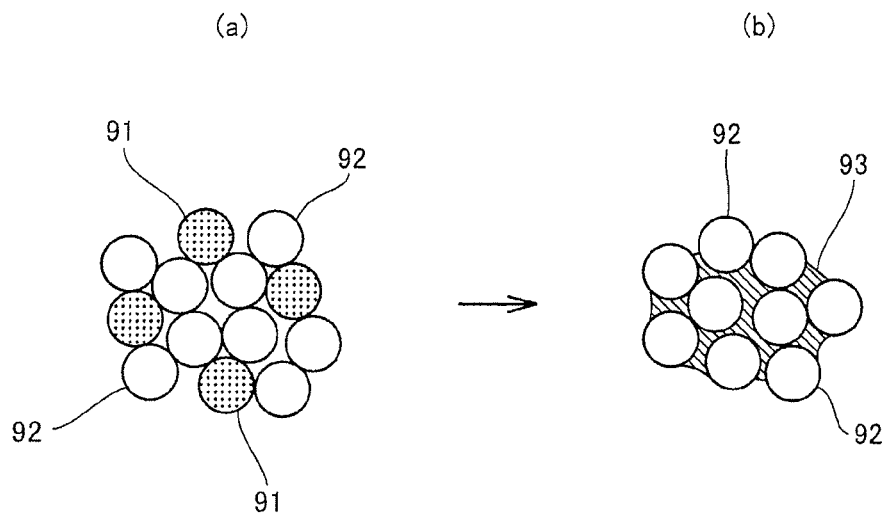
FIG. 4 includes schematic views illustrating the behavior of solder in soldering using a known solder paste.

Referring to FIG. 3, a plurality of resin layers 1 (resin layers 1A, 1B, 1C, and 1D) are disposed on a support 700.

The support 700 includes a base 701. The base 701 has a surface 701a on which the resin layers 1 are to be disposed.

The resin layers 1D, 1C, 1B, and 1A are stacked in this order on the surface 701a of the support 700.

The resin layers 1 are stacked such that surfaces 1a of adjacent resin layers 1 on which the conductive wiring layer 21 is disposed do not face each other. In the present embodiment, the resin layers 1 are stacked such that the surface 701a of the support 700 faces the surface 1a of the resin layer 1D, the surface 1b of the insulating substrate 1D faces the surface 1a of the resin layer 1C, the surface 1b of the insulating substrate 1C faces the surface 1b of the resin layer 1B, and the surface 1a of the resin layer 1B faces the surface 1b of the resin layer 1A.

The number and the stacking direction of the resin layers 1 are not limited to those described above and may be changed.

The resin layers 1 are then pressed in the stacking direction while being heated. The resin layers 1 are heated and pressed while being stacked on the support 700.

More specifically, the stacked resin layers 1 are disposed between a press plate 76 and a press plate 77. The press plate 76 is adjacent to the resin layer 1A, and the press plate 77 is adjacent to the resin layer 1D and the base 701 of the support 700. At least one of the press plate 76 and the press plate 77 can move in the stacking direction of the resin layers 1. The press plates 76 and 77 have an oil flow path 78 as heating means. The oil flow path 78 meanders through a plane perpendicular to the stacking direction of the resin layers 1. An oil flows through the oil flow path 78. The press plates 76 and 77 may include a heater as heating means.

In the present embodiment, a spacer 71 is disposed between the press plate 76 and the resin layer 1A. The spacer 71 is made of a thermally conductive metal.

In the present process, heating and pressurization with the press plates 76 and 77 decrease the height of the resin layers 1 in the stacking direction.

While a high-temperature oil flows through the oil flow path 78, the press plate 76 is brought closer to the press plate 77 for thermocompression bonding of the resin layers 1. The resin of the resin layers 1A and 1D flows to cover the conductive wiring layers 21 in the resin layers 1B and 1C.

The resin layers 1 after thermocompression bonding are cooled by supplying a low-temperature oil through the oil flow path 78. After cooling, the resin layers 1 subjected to thermocompression bonding are removed from the support 700.

During thermocompression bonding, the resin of the resin layer 1 flows from the center to the periphery of the resin layer 1, as viewed from the top. With such a flow of the resin, the relative positional relationship between the resin layers 1 and the relative positional relationship between the conductive wiring layers 21 in the resin layers 1 may change. However, a via-hole conductor 3 mainly composed of an intermetallic compound having a melting point of 300° C. or more is formed at a temperature lower than the softening temperature of the resin and can prevent the resin of the resin layer 1 from flowing out even if the resin is softened. Thus, the relative positional relationship between the resin layers 1 and the relative positional relationship between the conductive wiring layers 21 in the resin layers 1 can be maintained.

Although thermocompression bonding is performed while the resin layers 1 are stacked on the support 700 in the present embodiment, thermocompression bonding may be performed after the resin layers 1 are removed from the support 700. In this case, for example, the resin layers 1 may be removed from the support 700 after the sides of the resin layers 1 are temporarily fixed, for example, by welding.

Embodiment 2-1

A multilayer circuit board according to the present embodiment includes resin layers, which include a via-hole conductor for electrically connecting conductive wiring layers to each other. The multilayer circuit board includes an electronic component having an external electrode.

The via-hole conductor containing the intermetallic compound described above is more rigid and less flexible than copper for use in electrodes. Thus, the via-hole conductor can protect the electronic component from bending stress.

When the intermetallic compound is produced by a reaction between Sn and Cu—Ni, the diffusion velocity of Sn and Cu—Ni is 10 times or more higher than the diffusion velocity of a Sn and Ag or Sn and Cu metal system. The resulting via-hole conductor therefore generally has fine pores (voids). The pores act as cushions against external impacts or loads and reduce impacts or loads on the electronic component. Thus, a low-profile multilayer circuit board that includes an electronic component and is resistant to external stress can be manufactured.

Examples of the electronic component include active components, such as IC, and chip-type passive components, such as capacitors, resistances, and inductors. The electronic component includes an external electrode. The external electrode preferably has a surface containing Sn. The external electrode having a surface containing Sn may be a metal electrode, such as a Ni or Ag electrode, plated with Sn.

The external electrode having a surface containing Sn can supply a large amount of Sn. Thus, use of a known electroconductive paste results in a decreased melting point of a via-hole conductor. Such a via-hole conductor melts during a reflow process and develops a short circuit between the via-hole conductor and a conductive wiring layer. The external electrode having a surface containing Sn has also poor connection reliability. In contrast, according to the present invention, a via-hole conductor for connecting an external electrode of an electronic component to a conductive wiring layer is formed using an electroconductive paste that produces an intermetallic compound having a melting point of 300° C. or more by a reaction between the first metal and the second metal. The resulting high-melting-point via-hole conductor does not melt in a reflow process.

Figure 5:
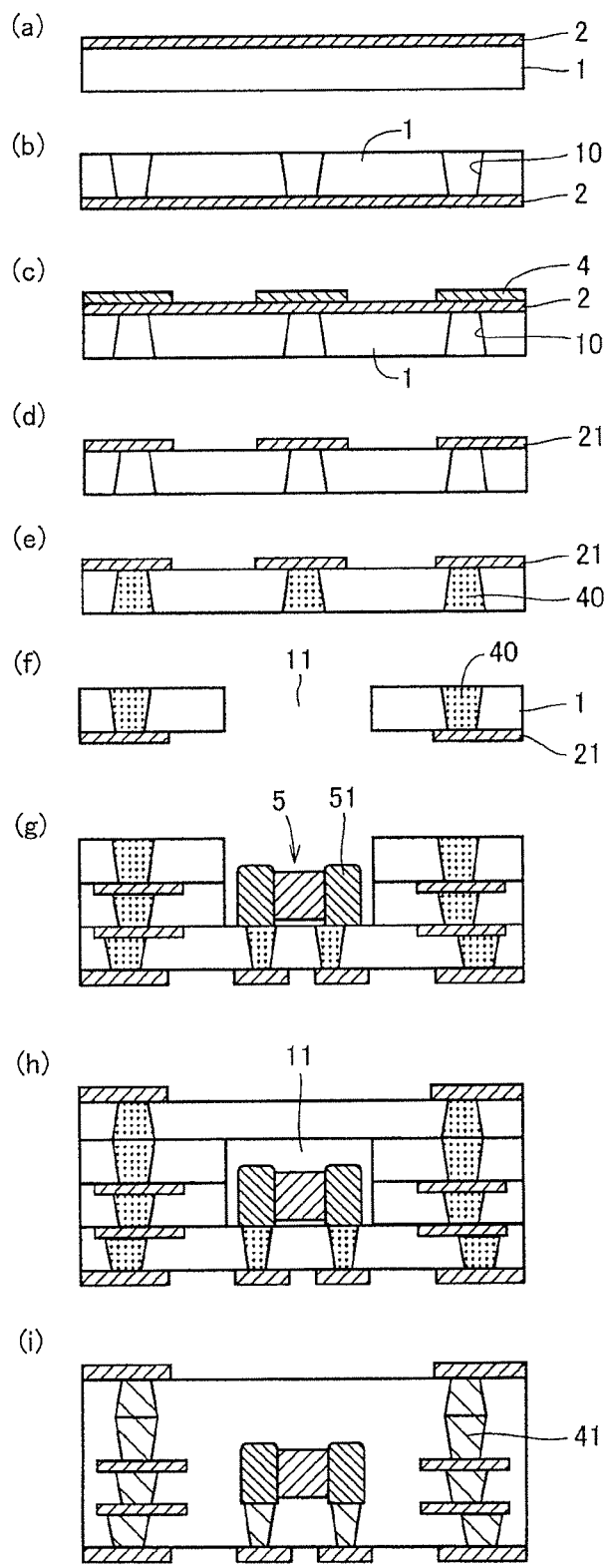
FIGS. 5(a) to 5(i) are schematic views illustrating a method for manufacturing a multilayer circuit board according to Embodiment 2-1.

A multilayer circuit board according to the present embodiment will be described below with reference to FIG. 5. As illustrated in FIG. 5(a), a conductive foil 2 is disposed on a resin sheet. A via-hole 10 reaching a conductive wiring layer 21 is bored in the resin sheet from its back side (opposite the conductive foil 2) (FIG. 5(b)). The via-hole 10 is formed through laser processing using a carbon dioxide laser or the like at each location at which an inner via (via-hole conductor) is to be formed. After boring a hole in the resin sheet, smears of resin residues are removed.

As illustrated in FIG. 5(c), a mask 4 is formed on the conductive foil 2. After an unnecessary portion of the conductive foil 2 is removed, for example, by photolithography, the mask 4 is removed. Thus, a conductive wiring layer 21 having a desired pattern is formed (FIG. 5(d)).

The via-hole 10 is then filled with an electroconductive paste 40, for example, by screen printing (FIG. 5(e)). A cavity 11 for an electronic component 5 is also formed (FIG. 5(f)).

The electronic component 5 is appropriately placed while a plurality of resin layers thus formed are stacked (FIG. 5(g)). The electronic component 5 is finally disposed in the cavity 11 (FIG. 5(h)). The resin layers are stacked such that the surfaces of adjacent resin layers 1 on which the conductive wiring layer 21 is disposed do not face each other. The electronic component 5 includes an external electrode 51 having a surface containing Sn and is placed so as to be electrically connected to part of the conductive wiring layer 21 through the via-hole conductor during subsequent thermocompression bonding. The number and the stacking direction of the resin layers 1 are not limited to those described above and may be changed.

The resin layers 1 are then pressed in the stacking direction while being heated. More specifically, for example, the stacked resin layers 1 are placed between press plates having heating means, and the press plates are brought closer to each other for thermocompression bonding of the resin layers 1. The resin of the resin layer 1 flows into the cavity 11 and surrounds the electronic component 5 (FIG. 5(i)).

In this process, a via-hole conductor 41 is also formed. The via-hole conductor 41 contains an intermetallic compound having a melting point of 300° C. or more produced by a reaction between the first metal and the second metal in the electroconductive paste 40. The via-hole conductor 41 electrically connects the conductive wiring layers 21 to each other. The electronic component 5 includes the external electrode 51 having a surface containing Sn. The conductive wiring layer 21 is also electrically connected to the external electrode 51 of the electronic component 5.

The resin layers 1 subjected to thermocompression bonding is cooled to produce a multilayer circuit board including the electronic component.

Embodiment 2-2

Figure 6:
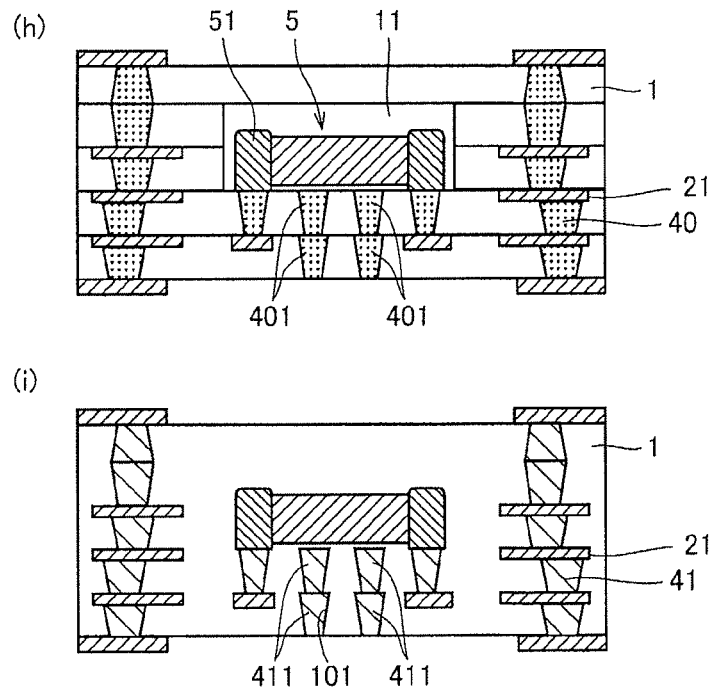
FIGS. 6(h) and 6(i) are schematic views illustrating a multilayer circuit board according to Embodiment 2-2.

A multilayer circuit board according to the present embodiment will be described below with reference to FIG. 6. The processes illustrated in FIGS. 5(a) to 5(g) in the present embodiment are the same as in Embodiment 2-1 and will not be further described.

An electronic component 5 is appropriately placed while a plurality of resin layers are stacked. The electronic component 5 is finally disposed in the cavity 11 (FIG. 6(h)). In the present embodiment, a via-hole 101 is disposed at a location at which a protective via-hole conductor 411 not connected to a conductive wiring layer 21 is to be formed. The via-hole 101 is filled with an electroconductive paste 401. The electroconductive paste 401 is composed of the same material as the via-hole conductor 40.

The resin layers are stacked such that the surfaces of adjacent resin layers 1 on which the conductive wiring layer 21 is disposed do not face each other. The electronic component 5 includes an external electrode 51 having a surface containing Sn and is placed so as to be electrically connected to part of the conductive wiring layer 21 through the via-hole conductor during subsequent thermocompression bonding. The number and the stacking direction of the resin layers 1 are not limited to those described above and may be changed.

The resin layers 1 are subjected to thermocompression bonding in the same manner as in Embodiment 1, and the electronic component 5 is surrounded by the resin (FIG. 6(i)).

In this process, via-hole conductors 41 and 411 are also formed. The via-hole conductors 41 and 411 contain an intermetallic compound having a melting point of 300° C. or more produced by a reaction between the first metal and the second metal in the electroconductive pastes 40 and 401. Thus, the conductive wiring layers 21 are electrically connected to each other, and the conductive wiring layer 21 is electrically connected to the external electrode 51 of the electronic component 5. The protective via-hole conductor 411 is not connected to the conductive wiring layer 21. The protective via-hole conductor 411 can increase the strength of the multilayer circuit board and it protects the electronic component 5 from external stress.

The resin layers 1 subjected to thermocompression bonding is cooled to produce a multilayer circuit board including the electronic component.

Embodiment 2-3

Figure 7:
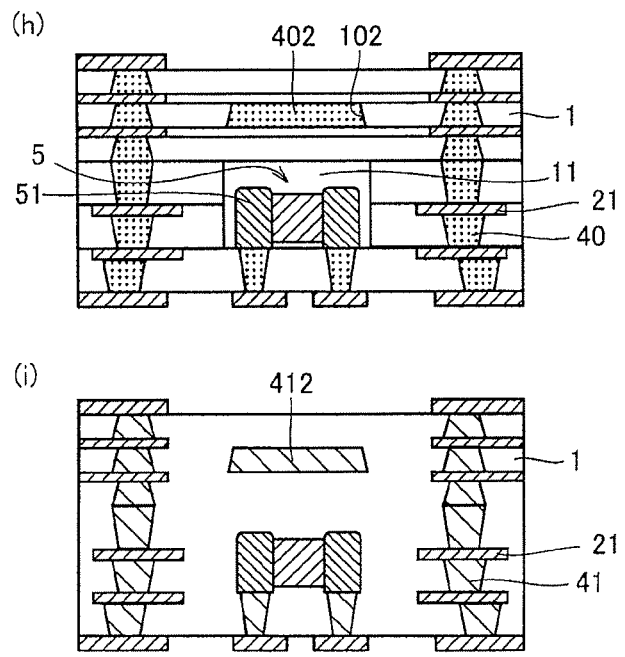
FIGS. 7(h) and 7(i) are schematic views illustrating a multilayer circuit board according to Embodiment 2-3.

A multilayer circuit board according to the present embodiment will be described below with reference to FIG. 7. The present embodiment is different from Embodiment 2-2 only in that the area of the main surface of a protective via-hole conductor 412 is larger than the area of the main surface of a via-hole conductor 41 for connection of another multilayer circuit board and is substantially the same as the area of the main surface of an electronic component 5 placed in the multilayer circuit board. The processes illustrated in FIGS. 5(a) to 5(g) in the present embodiment are the same as in Embodiment 2-1 and will not be further described.

In the present embodiment, a via-hole 102 illustrated in FIG. 7(h) is filled with an electroconductive paste 402, which is composed of the same material as the via-hole conductor 40.

The via-hole conductor 412 formed by heating the electroconductive paste 402 (FIG. 7(i)) can increase the strength of the multilayer circuit board and protect the electronic component 5 from external stress.

The protective via-hole conductor 412 that is not electrically connected to the conductive wiring layer 21 or the external electrode 51 is preferably disposed between the electronic component 5 and a surface of the multilayer circuit board so as not to be in direct contact with the electronic component. In the present embodiment, the resin layers are stacked such that the resin layer 1 is disposed between the protective via-hole conductor 412 and the electronic component 5 (FIG. 7(i)).

Figure 8:
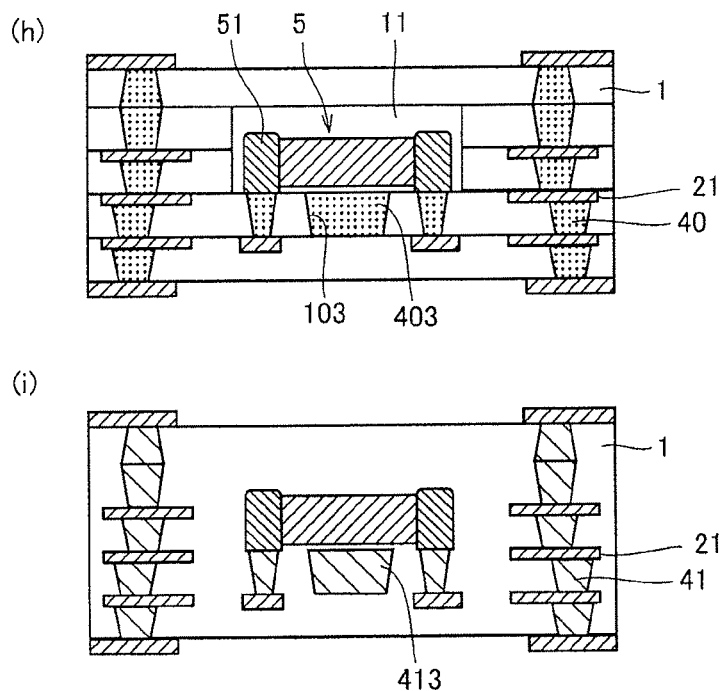
FIGS. 8(h) and 8(i) are schematic views illustrating another multilayer circuit board according to Embodiment 2-3.

However, the resin layer 1 is not necessarily disposed between the protective via-hole conductor and the electronic component 5. When the electronic component 5 is subjected to insulation treatment or does not cause a short circuit, a protective via-hole conductor 413 (FIG. 8(i)) may also work. The protective via-hole conductor 413 is formed by heat treatment of an electroconductive paste 403 (FIG. 8(h)) charged into the via-hole 103 in the resin layer 1 adjacent to the electronic component 5.

In Embodiments 2-1 to 2-3, the intermetallic compound produced by a reaction between the first metal and the second metal can increase the strength of the via-hole conductor and the absorption of external stress. Thus, in the case of a low-profile multilayer circuit board including an electronic component, the electronic component can be protected from physical damage caused by external stress.

Embodiment 3

A multilayer circuit board according to the present embodiment includes resin sheets, which include via-hole conductors for electrically connecting conductive wiring layers to each other. The multilayer circuit board includes a plurality of connection terminals on at least one of its surfaces. The connection terminals can connect conductive wiring layers to an electrode of an electronic component in the multilayer circuit board.

Figure 9:
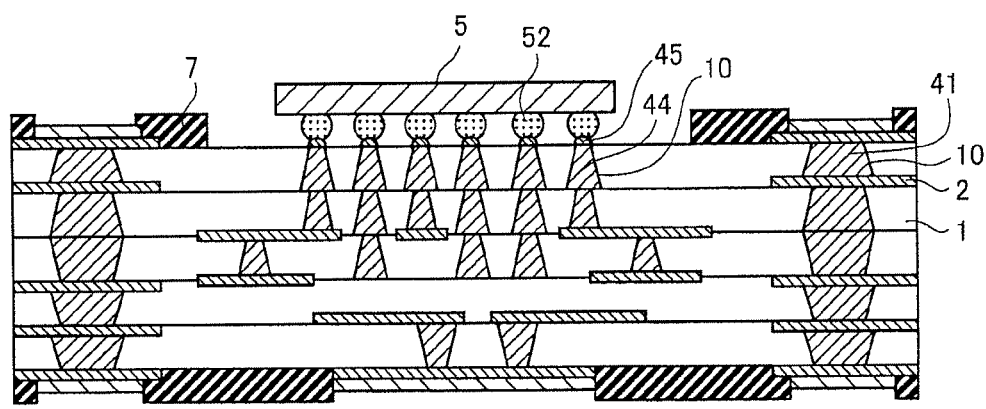
FIG. 9 is a schematic view illustrating a multilayer circuit board according to Embodiment 3.

The multilayer circuit board according to the present embodiment will be described below with reference to FIG. 9. The multilayer circuit board according to the present embodiment includes a plurality of resin layers, each of which includes a resin sheet containing a resin and a conductive wiring layer 2 disposed on at least one surface of the resin sheet. The resin sheet includes a via-hole conductor 41 for electrically connecting the conductive wiring layers 2 to each other. A plurality of connection terminals 44 for connecting the conductive wiring layers 2 to an electrode 52 of an electronic component 5 in the multilayer circuit board are disposed on at least one surface of the multilayer circuit board.

The via-hole conductor 41 and the connection terminals 44 include an intermetallic compound having a melting point of 300° C. or more produced by a reaction between the first metal and the second metal.

The connection terminals 44 are preferably covered with (metal) plating 45. The connection terminals 44 has low resistance and excellent platability. Thus, the plating 45 can improve the connection between the connection terminals 44 of the multilayer circuit board and electrodes 52 of an electronic component 5 in the multilayer circuit board.

The components constituting the multilayer circuit board, such as via-hole conductors, are described above.

The present embodiment can provide a multilayer circuit board that includes low-resistance connection terminals having excellent platability. This is because a connection terminal containing an intermetallic compound has low resistance and excellent platability. This can improve the connection between the connection terminals of the multilayer circuit board and electrodes of an electronic component in the multilayer circuit board.

In the present embodiment, since smaller spacing between electrodes for surface mounting than before rarely causes a short circuit, the electrodes for surface mounting can be closely arranged. This can reduce the size and increase the mounting density of the multilayer circuit board. This is because a short heat treatment at a relatively low temperature in the present embodiment rapidly converts a low-melting-point first metal in a via-hole conductor and a connection terminal into a high-melting-point intermetallic compound, thereby forming a heat-resistant via-hole conductor and a heat-resistant connection terminal. This is also because the connection terminal can have a smaller area than a connection terminal having a land.

Figure 10:
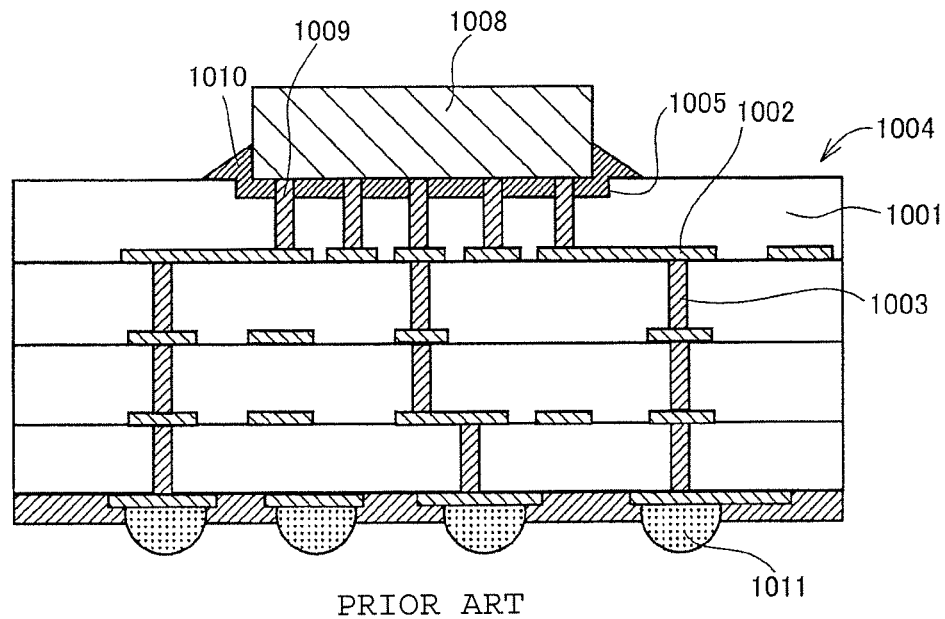
FIG. 10 is a schematic view illustrating a known multilayer circuit board.

As illustrated in FIG. 10, Japanese Unexamined Patent Application Publication No. 2003-249765 discloses a multilayer circuit board 1004 as the related art. The multilayer circuit board 1004 includes a plurality of insulating films 1001, each of which includes a wiring conductor 1002 of metallic foil on at least one of the top and bottom surfaces thereof. Wiring conductors 102 on the top and the bottom of the insulating films 1001 are electrically connected to each other via a through conductor 1003 formed in the insulating films 1001 (Japanese Unexamined Patent Application Publication No. 2003-249765, paragraph [0037]).

One of the top and bottom insulating films 1001 of the multilayer circuit board 1004 has a depressed portion 1005. Connection conductors (connection terminals) 1009 protrude from the bottom of the depressed portion 1005. The connection conductors 1009 can be directly connected to an electrode of an electronic component 1008. This obviates the necessity of forming a solder bump, for example, by printing and prevents a decrease in the pitch distance of the connection terminals 1009 caused by the spread of paste in printing or prevents the bridging of solder between the connection terminals 1009 after solder reflow. Thus, the multilayer circuit board 1004 has high insulation reliability (Japanese Unexamined Patent Application Publication No. 2003-249765, paragraph [0051]).

The connection conductors 1009 on the top surface of the multilayer circuit board 1004 are electrically connected to an electrode of the electronic component 1008, such as a semiconductor element. The space between the electronic component 1008 and the multilayer circuit board 1004 is filled with an underfill material 1010, for example, composed of a thermosetting resin, and the underfill material 1010 is hardened to fix the electronic component 1008. Conductive bumps 1011, for example, made of solder are formed on a connection pad composed of a portion of the wiring conductor 1002 disposed on the undersurface of the multilayer circuit board 1004. The resulting hybrid integrated circuit has a high wiring density and excellent insulation performance (Japanese Unexamined Patent Application Publication No. 2003-249765, paragraph [0059]).

Japanese Unexamined Patent Application Publication No. 2003-249765 also discloses that the surface of the connection conductors 1009 extending from the bottom of the depressed portion 1005 is plated with a metal, for example, by known electrolytic or electroless nickel plating and electrolytic or electroless gold plating. This can improve the reliability of connection between an electrode of the electronic component 1008 on the multilayer circuit board 1004 and the connection conductors 1009 (Japanese Unexamined Patent Application Publication No. 2003-249765, paragraphs [0056]and [0057]).

However, known electroconductive pastes contain resin that is likely to remain after heat treatment (for example, acrylic resin or epoxy resin). A surface of a connection terminal made of such a known electroconductive paste is difficult to plate. Thus, it is difficult to improve the reliability of connection between a connection terminal of a multilayer circuit board and an electrode of an electronic component placed in the multilayer circuit board.

Embodiment 4

A multilayer circuit board according to the present embodiment includes resin layers that include via-hole conductors for electrically connecting conductive wiring layers to each other. The multilayer circuit board also has a cavity and an electronic component disposed in the cavity. Part of the conductive wiring layers function as heat radiation patterns for radiating heat generated by the electronic component. Part of the via-hole conductors function as thermal vias for connecting the electronic component to the conductive wiring layers functioning as the heat radiation patterns.

Figure 11:
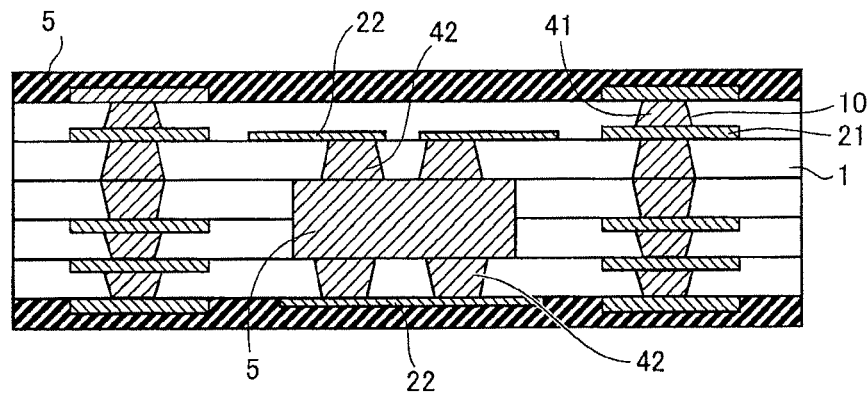
FIG. 11 is a schematic view illustrating a multilayer circuit board according to Embodiment 4.

The multilayer circuit board according to the present embodiment will be described below with reference to FIG. 11. The multilayer circuit board according to the present embodiment includes a plurality of resin layers 1, each of which includes a resin sheet containing a resin and a conductive wiring layer 21 disposed on at least one surface of the resin sheet. The resin sheet includes a via-hole conductor 41 for electrically connecting the conductive wiring layers 21 to each other.

The multilayer circuit board further includes an electronic component 5 and via-hole conductors (thermal vias) 42 for connecting heat radiation patterns 22 for radiating heat generated by the electronic component 5 to the electronic component 5.

Each of the via-hole conductors 41 and the via-hole conductors (thermal vias) 42 includes an intermetallic compound having a melting point of 300° C. or more produced by a reaction between the first metal and the second metal.

In the present embodiment, the surfaces of the conductive wiring layers 21 and the conductive wiring layers (heat radiation patterns) 22 in contact with the via-hole conductors 41 and 42 are preferably roughened. The roughening method may be one of various methods known in this field, for example, a method for etching a surface, a method for forming nodular particles by plating, or a mechanical roughening method. Roughening can increase the area of an interface between the conductive wiring layer 21 and the via-hole conductor 41 or between the conductive wiring layer (heat radiation pattern) 22 and the via-hole conductor (thermal via) 42. Thus, the multilayer circuit board has excellent electrical conductivity and heat radiation characteristics between the conductive wiring layer 21 and the via-hole conductor 41 or the conductive wiring layer (heat radiation pattern) 22 and the via-hole conductor (thermal via) 42.

Figure 12:
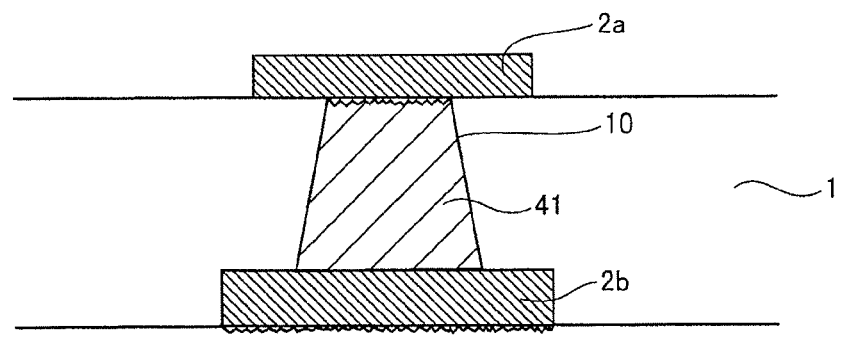
FIG. 12 is a fragmentary enlarged view of FIG. 11.

FIG. 12 is a fragmentary enlarged view of the via-hole 10. As illustrated in FIG. 12, the via-hole 10 usually has a tapered side surface. This is because the via-hole 10 is bored using carbon dioxide laser radiation from a surface opposite the surface on which a conductive wiring layer is formed, as described below. Thus, the contact area between the conductive wiring layer 2a and the via-hole conductor 41 is smaller than the contact area between the conductive wiring layer 2b and the via-hole conductor 41. In this case, at least the surface of the conductive wiring layer 2a in contact with the via-hole conductor 41 is preferably roughened. This is because a smaller interface is likely to have poorer electrical conductivity and heat radiation characteristics, and therefore surface roughening of the smaller interface can effectively improve electrical conductivity and heat radiation characteristics.

In the example illustrated in FIG. 12, the surface of the conductive wiring layer 2b in contact with the via-hole conductor 41 is not roughened. Whether the interfaces between the conductive wiring layers 2a and 2b and the via-hole conductor 41 are roughened or not, use of the electroconductive paste described above can provide a bond having low contact resistance. In contrast, with a known electroconductive paste containing a Sn—Ag alloy, although a flat interface between a via-hole conductor and a conductive wiring layer exhibits well bonding, the bonding at a rough interface between a via-hole conductor and a conductive wiring layer depends on the pressure of heat press.

A multilayer circuit board according to the present embodiment includes a via-hole conductor having excellent electrical conductivity (low resistance) or heat radiation characteristics. In particular, even when an interface between a conductive wiring layer or a heat radiation pattern layer and a via-hole conductor is roughened, use of the above-mentioned electroconductive paste for the via-hole conductor results in the uniform formation of an intermetallic compound at the interface between the conductive wiring layer or the heat radiation pattern layer and the via-hole conductor and increases the interface area. Thus, the resulting multilayer circuit board includes a via-hole conductor having excellent electrical conductivity (low resistance) or heat radiation characteristics.

Embodiment 5

A multilayer circuit board according to the present embodiment includes a resin sheet including via-hole conductors for electrically connecting conductive wiring layers to each other. At least part of the via-hole conductors in the resin sheet are directly connected to via-hole conductors in an adjacent resin sheet without through a via-receiving conductor pattern.

A method for manufacturing a multilayer circuit board according to the present embodiment will be described below with reference to FIG. 13.

As illustrated in FIG. 13(a), a resin sheet and a conductive foil 2 on one surface of the resin sheet are formed.

The resin sheet may be a resin sheet containing the resin described above. The resin of the resin sheet may flow during heat treatment. Thus, it is desirable that heat treatment in pressing described below be performed at a relatively low temperature. In particular, when the resin is a thermoplastic resin, which is highly likely to flow during heat treatment, it is desirable that heat treatment be performed at a relatively low temperature.

The material of the conductive foil may be copper, silver, aluminum, SUS, nickel, gold, or an alloy thereof, preferably copper. The conductive foil may have any thickness, provided that a circuit can be formed, and may be in the range of approximately 3 to 40 μm.

One surface of the conductive foil may be roughened in order to improve adhesion to the resin sheet. The roughness (Rz) of the rough surface may be in the range of 1 to 15 μm. The conductive foil can bite into the resin sheet, which enhances the bonding between the conductive foil and the resin sheet.

Formation of Conductive Wiring Layer

As illustrated in FIG. 13(b), a mask 4 is formed on the conductive foil 2. After an unnecessary portion of the conductive foil 2 is removed, for example, by photolithography, the mask 4 is removed. Thus, a conductive wiring layer 21 having a desired pattern is formed (FIG. 13(c)).

The conductive wiring layer may be formed not only by this method but also by one of various known methods. For example, after conductive foil is bonded to a surface of the resin sheet or is placed on a surface of the resin sheet (laminate) without using an adhesive, the conductive foil may be etched to form a wiring circuit. Alternatively, conductive foil formed into the shape of a wiring circuit may be transferred to the resin sheet. Alternatively, a circuit may be formed on a surface of the resin sheet by metal plating.

Formation of Via-Hole

As illustrated in FIG. 13(d), a via-hole 10 is formed in the resin layer 1 at a predetermined position at which the conductive wiring layer 21 is formed. For example, the via-hole 10 may be bored using carbon dioxide laser radiation in the resin layer 1 from a surface opposite the surface on which the conductive wiring layer 21 is disposed. If necessary, residual smears (resin residues) in the via-hole formed through laser processing are removed by general-purpose chemical solution treatment, for example, using permanganic acid.

Filling with Electroconductive Paste

Figure 13:
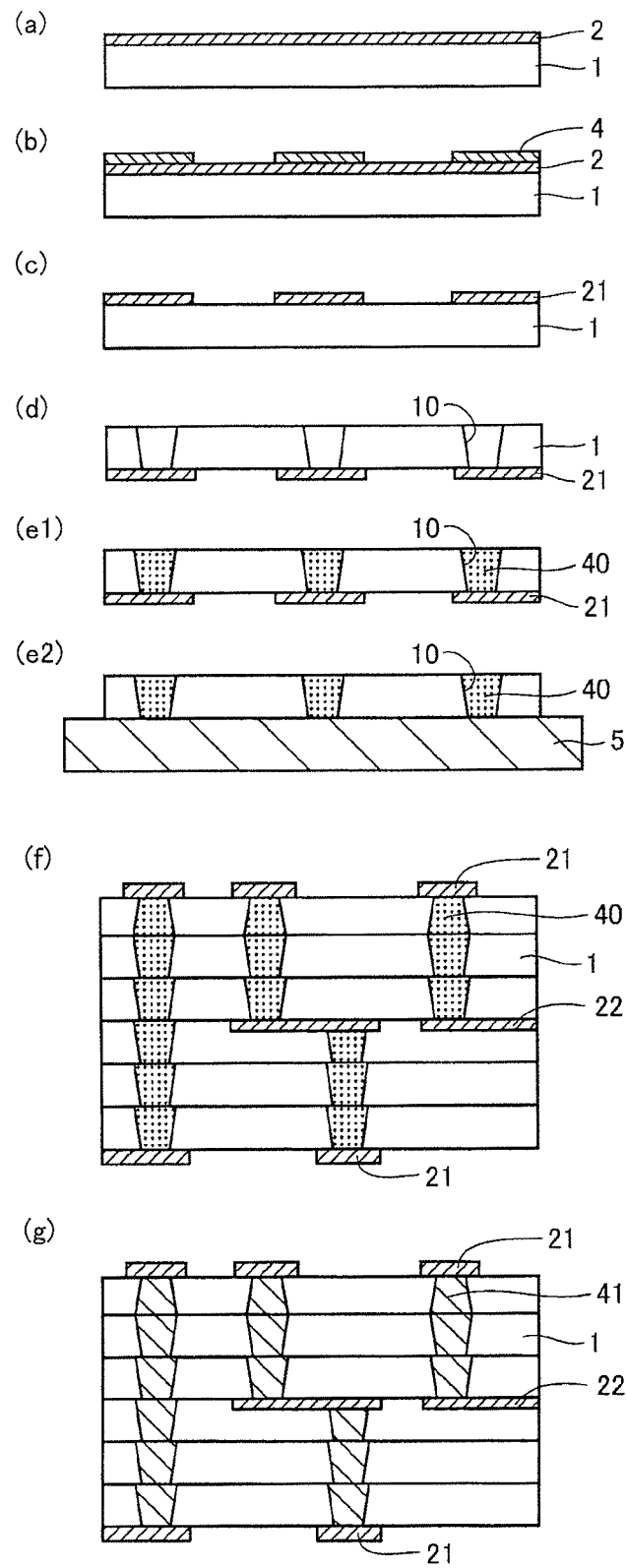
FIGS. 13(a) to 13(g) are schematic views illustrating a method for manufacturing a multilayer circuit board according to Embodiment 5.

As illustrated in FIG. 13(d), the resin layer 1 on which the conductive wiring layer 21 is formed is inverted. The via-hole 10 is then filled with an electroconductive paste 40 by screen printing or vacuum filling (FIG. 13(e1)).

A resin sheet including only via-holes 10 (without a conductive wiring layer) is separately prepared and placed on a support 5. The via-holes 10 are filled with the electroconductive paste 40 (FIG. 13(e2)). The via-holes 10 without a conductive wiring layer may be filled with the electroconductive paste by another method. For example, the via-holes 10 may be filled with the electroconductive paste while the via-holes 10 are closed with a removable film at its one end. Although not shown in the figures, a resin sheet that includes a conductive wiring layer at one end of a via-hole and no conductive wiring layer at both ends of another via-hole is prepared for a multilayer structure illustrated in FIG. 13(f), and the via-holes are filled with the electroconductive paste in the same manner. The electroconductive paste can yield an intermetallic compound having a melting point of 300° C. or more by a reaction between the first metal and the second metal.

Stacking and One-Time Press Bonding of Resin Layers (Resin Sheets)

As illustrated in FIG. 13(f), a plurality of resin layers 1 including an electroconductive paste thus formed are stacked. Between a conductive wiring layer (surface electrode) 21 and a conductive wiring layer (internal wiring layer) 22, the via-holes 10 of the resin layers 1 constitute a continuous through hole, and the electroconductive paste 40 charged in one resin layer 1 is in contact with the electroconductive paste 40 charged in an adjacent resin layer 1. The number and the stacking direction of the resin layers 1 are not limited to those described above and may be changed.

The resin layers 1 are then pressed in the stacking direction while being heated. The pressurization is intended to bond resin sheets together, and one electroconductive paste can be joined to another electroconductive paste without pressurization. This obviates the necessity for high pressurization performed in known multilayer boards.

The heat treatment temperature is preferably 230° C. or more at least for a predetermined period of time. When the treatment temperature does not reach 230° C., Sn (melting point: 232° C.) in the first metal does not melt and cannot form an intermetallic compound. The maximum temperature of the heat treatment is preferably 300° C. or less. When the maximum temperature of the heat treatment exceeds 300° C., and the resin sheet contains LCP as the resin, the resin may flow out. Although the flow temperature of the resin (LCP) at a pressure of 0 Pa depends on its molecular weight, the resin starts to flow at a temperature of approximately 315° C.

Heat treatment during press bonding causes the flux component in the via paste to be decomposed and volatilize simultaneously with the bonding between the resin sheets. Sn in the first metal reacts with the second metal (such as Cu—Ni or Cu—Mn) to form an intermetallic compound. At an interface between a conductive wiring layer and a via-hole conductor, a metal of the conductive wiring layer reacts with the first metal of the via-hole conductor to form an alloy layer.

An example of suitable heat treatment may be two-stage heat treatment in which the solvent of the flux component is volatilized by heat treatment at a temperature in the range of approximately 200° C. to 250° C. (for example, 200° C.) while substantially no pressure is applied to stacked resin layers 1, and the stacked resin layers 1 are then heated to a temperature in the range of approximately 280° C. to 300° C. (for example, 290° C.) while a pressure in the range of approximately 1 to 10 MPa (for example, 4 MPa) is applied to both sides of the stacked resin layers 1. When the stacked resin layers are heated to a temperature in the range of approximately 280° C. to 300° C., the resin of the resin sheets is softened, and the resin sheets are bonded together. Simultaneously, the flux component other than the solvent in the via paste is decomposed and volatilizes. Sn in the first metal reacts with the second metal to form an intermetallic compound, thereby forming a via-hole conductor. Since substantially all the flux component in the electroconductive paste volatilizes, there is no organic component in the via-hole conductor.

A via-hole conductor 41 is formed through the heat treatment. The via-hole conductor 41 contains an intermetallic compound having a melting point of 300° C. or more produced by a reaction between the first metal and the second metal in the electroconductive paste 40. Thus, the conductive wiring layers (the surface electrode 21 and the internal wiring layer 22, or the internal wiring layers 22) are electrically connected to each other (FIG. 13(g)).

The resin layers 1 after thermocompression bonding are cooled to produce a multilayer circuit board according to the present embodiment.

In the present embodiment, an electroconductive paste having a particular composition is used to connect conductive wiring layers to each other through via-hole conductors having no via-receiving conductor pattern. This can provide a multilayer circuit board having excellent connection reliability and high-frequency characteristics.

The connection of via-hole conductors has required a via-receiving conductor pattern so as to improve the connection of the via-hole conductors. Thus, a joint of via-hole conductors has a projection having a via-receiving conductor pattern. When such a multilayer circuit board is used as a high-frequency circuit, the electric current flows through the surface of the conductor because of the skin effect. Thus, there is a problem that this causes deterioration in high-frequency characteristics at the projection. An electroconductive paste for use in the present invention is easy to join without pressurization and requires no via-receiving pattern. Thus, the resulting multilayer circuit board has excellent connection reliability and high-frequency characteristics.

Embodiment 6

Multilayer Circuit Board

A multilayer circuit board according to the present embodiment is manufactured by cutting a multilayer composite board. The multilayer composite board includes a plurality of resin layers, each of which includes a resin sheet and a conductive wiring layer disposed on at least one surface of the resin sheet. The multilayer composite board is cut into multilayer circuit boards.

The multilayer composite board includes a via-hole conductor that can be cut simultaneously with cutting of the multilayer composite board to form an external electrode of a multilayer chip component. The external electrode is electrically connected to a conductive wiring layer connected to such a via-hole conductor.

A multilayer circuit board manufactured by cutting a multilayer composite board can be mounted on a circuit board as an electronic component or a functional module component. Examples of the electronic component include passive components, such as filters, capacitors, resistances, and inductors. A multilayer circuit board including an IC chip on a surface or in an interior thereof may be used as an active component.

Method for Manufacturing Multilayer Circuit Board

An example of a method for manufacturing a multilayer circuit board according to the present embodiment will be described below with reference to FIGS. 14(a) to 14(e), FIG. 15, and FIG. 16. In the method for manufacturing a multilayer circuit board, a via-hole in a resin layer is formed such that a via-hole conductor in the via-hole can be cut simultaneously with cutting of the multilayer composite board.

(1) Step of Manufacturing Multilayer Composite Board

Figure 14:
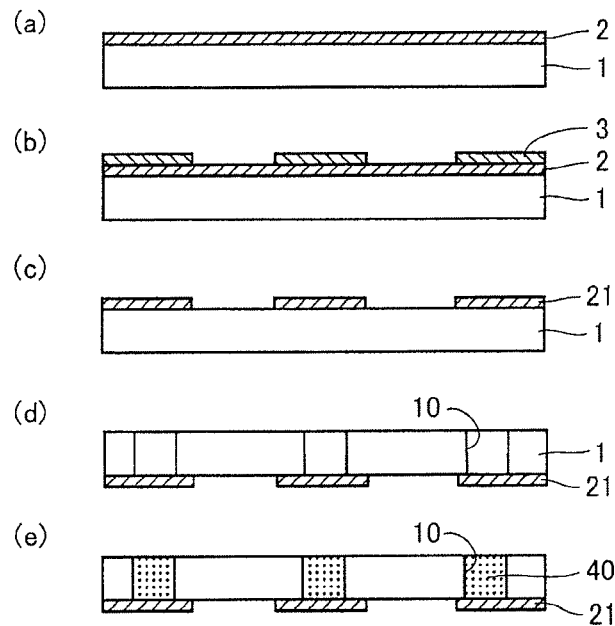
FIGS. 14(a) to 14(e) are first schematic views illustrating a method for manufacturing a multilayer circuit board according to Embodiment 6.

As illustrated in FIG. 14(a), a resin sheet and a conductive foil 2 on one surface of the resin sheet are formed.

The resin sheet may be a resin sheet containing the resin described above. The resin of the resin sheet may flow during heat treatment. Thus, it is desirable that heat treatment in pressing described below be performed at a relatively low temperature. In particular, when the resin is a thermoplastic resin, which is highly likely to flow during heat treatment, it is desirable that heat treatment be performed at a relatively low temperature.

The material of the conductive foil may be copper, silver, aluminum, SUS, nickel, gold, or an alloy thereof, preferably copper. The conductive foil may have any thickness, provided that a circuit can be formed, and may be in the range of approximately 3 to 40 μm. The conductive foil is preferably roughened on its surface so as to improve its adhesion to the resin sheet. The roughness (Rz) of the rough surface may be in the range of 1 to 15 μm. The conductive foil can bite into the resin sheet, which enhances the bonding between the conductive foil and the resin sheet. This also roughens the surface of the conductive wiring layer in contact with the electroconductive paste. However, use of an electroconductive paste that produces an intermetallic compound having a melting point of 300° C. or more by a reaction between the first metal and the second metal results in the uniform formation of the intermetallic compound at the interface between the conductive wiring layer and the electroconductive paste and increases the interface area. Thus, the resulting via-hole conductor has high electrical conductivity (low resistance).

Formation of Conductive Wiring Layer

As illustrated in FIG. 14(b), a mask 3 is formed on the conductive foil 2. After an unnecessary portion of the conductive foil 2 is removed, for example, by photolithography, the mask 3 is removed. Thus, a conductive wiring layer 21 having a desired pattern is formed (FIG. 14(c)). The conductive wiring layer 21 is disposed over a cutting line of a multilayer composite board composed of the resin layers 1.

The conductive wiring layer may be formed not only by this method but also by one of various known methods. For example, after conductive foil is bonded to a surface of the resin sheet or is placed on a surface of the resin sheet without using an adhesive (laminate), the conductive foil may be etched to form a wiring circuit. Alternatively, conductive foil formed into the shape of a wiring circuit may be transferred to the resin sheet. Alternatively, a circuit may be formed on a surface of the resin sheet by metal plating.

Formation of Via-Hole

As illustrated in FIG. 14(d), a via-hole 10 is formed in the resin layer 1 at a predetermined position at which the conductive wiring layer 21 is formed. For example, the via-hole 10 may be bored using carbon dioxide laser radiation or mechanical punching in the resin layer from a surface opposite the surface on which the conductive wiring layer 21 is disposed. If necessary, residual smears (resin residues) in the via-hole 10 formed through laser processing are removed by general-purpose chemical solution treatment, for example, using permanganic acid. The via-hole 10 can be cut simultaneously with cutting a multilayer composite board composed of the resin layers 1.

Filling with Electroconductive Paste

As illustrated in FIG. 14(d), the resin sheet 1 on which the conductive wiring layer 21 is formed is inverted. The via-hole 10 is then filled with an electroconductive paste 40 by screen printing or vacuum filling (FIG. 14(e)). The electroconductive paste may be that described above.

Stacking and One-Time Press Bonding of Resin Layers (Manufacture of Multilayer Composite Board)

Figure 15:
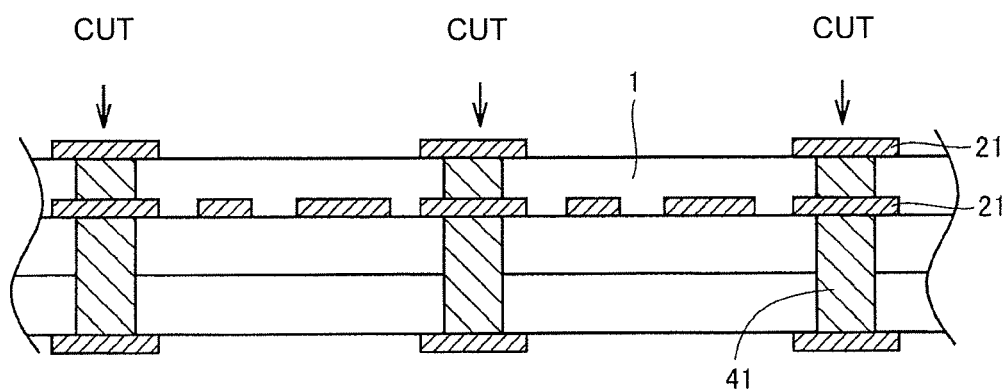
FIG. 15 is a second schematic view illustrating the method for manufacturing a multilayer circuit board according to Embodiment 6.

As illustrated in FIG. 15, a plurality of resin layers 1 including an electroconductive paste thus formed are stacked so as to form a multilayer composite board. The number and the stacking direction of the resin layers 1 are not limited to those described above and may be changed.

The resin layers 1 are then pressed in the stacking direction while being heated.

The heat treatment temperature is preferably 230° C. or more at least for a predetermined period of time. When the treatment temperature does not reach 230° C., Sn (melting point: 232° C.) in the first metal does not melt and cannot form an intermetallic compound. The maximum temperature of the heat treatment is preferably 300° C. or less. When the maximum temperature of the heat treatment exceeds 300° C., and the resin sheet contains LCP as the resin, the resin may flow out. Although the flow temperature of the resin (LCP) at a pressure of 0 Pa depends on its molecular weight, the resin starts to flow at a temperature of approximately 315° C.

Heat treatment during press bonding causes the flux component in the via paste to be decomposed and volatilize simultaneously with the bonding between the resin sheets. Sn in the first metal reacts with the second metal (such as Cu—Ni or Cu—Mn) to form an intermetallic compound. At an interface between a conductive wiring layer and a via-hole conductor, a metal of the conductive wiring layer reacts with the first metal of the via-hole conductor to form an alloy layer.

An example of suitable heat treatment may be a two-stage heat treatment in which the solvent of the flux component is volatilized by heat treatment at a temperature in the range of approximately 200° C. to 250° C. (for example, 200° C.) while substantially no pressure is applied to stacked resin layers, and the stacked resin layers are then heated to a temperature in the range of approximately 280° C. to 300° C. (for example, 290° C.) while a pressure in the range of approximately 1 to 10 MPa (for example, 4 MPa) is applied to both sides of the stacked resin layers. When the stacked resin layers are heated to a temperature in the range of approximately 280° C. to 300° C., the resin of the resin sheets is softened, and the resin sheets are bonded together. Simultaneously, the flux component other than the solvent in the via paste is decomposed and volatilizes. Sn in the first metal reacts with the second metal to form an intermetallic compound, thereby forming a via-hole conductor. Since substantially all the flux component in the electroconductive paste volatilizes, there is no organic component in the via-hole conductor.

A via-hole conductor 41 is formed through the heat treatment. The via-hole conductor 41 contains an intermetallic compound having a melting point of 300° C. or more produced by a reaction between the first metal and the second metal in the electroconductive paste 40. Thus, conductive wiring layers 21, 21 are electrically connected to each other, and a multilayer composite board is completed (FIG. 15).

(2) Step of Manufacturing Multilayer Circuit Board

Figure 16:
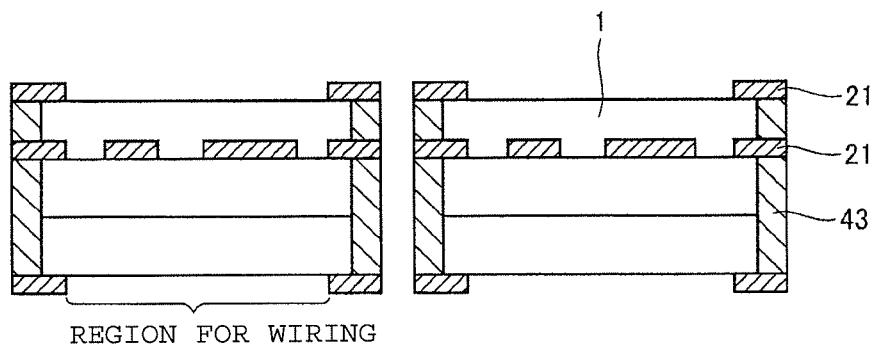
FIG. 16 is a schematic cross-sectional view of a multilayer circuit board according to Embodiment 6.

The multilayer composite board thus manufactured includes a plurality of blocks each serving as a multilayer circuit board. The blocks are divided at the cutting positions indicated by the arrows in FIG. 15 by using one of various known method, such as dicing or cutting with a lever shear. Thus, the multilayer composite board is divided into multilayer circuit boards according to the present embodiment (FIG. 16). At the same time, the via-hole conductor 41 is cut and exposed at a surface of a multilayer circuit board to form an external electrode 43.

Figure 17:
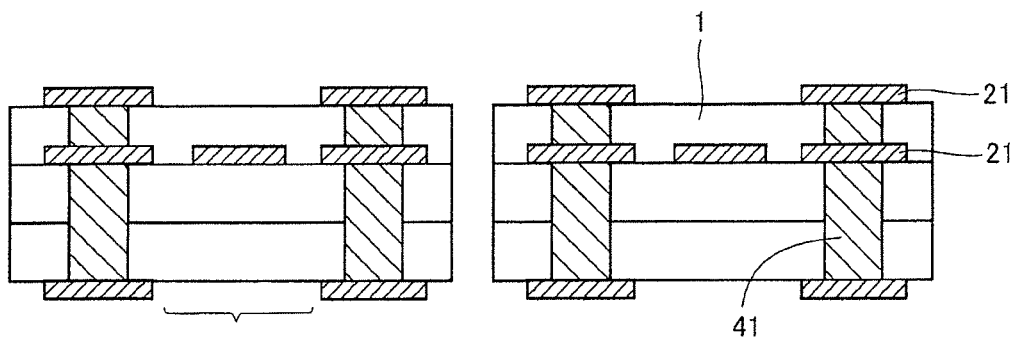
FIG. 17 is a schematic cross-sectional view of a known multilayer circuit board.

As illustrated in FIG. 16, the conductive wiring layers 2 of the multilayer circuit board are connected to each other through the external electrode 43 formed by cutting the via-hole conductor 41. The multilayer circuit board has a larger region for wiring than a multilayer chip component illustrated in FIG. 17 in which the conductive wiring layers 2 are connected to each other through the via-hole conductor 41. Thus, the multilayer circuit board is advantageous in terms of the miniaturization of a multilayer circuit board.

In the present embodiment, a particular electroconductive paste can be used in heat treatment at a relatively low temperature to form an external electrode having excellent heat resistance and bonding reliability. Thus, even a multilayer circuit board manufactured by cutting a multilayer composite board composed of a plurality of resin layers containing a resin can be manufactured at low cost, and the multilayer circuit board thus manufactured has high heat resistance. In the present embodiment, the via-hole conductor is disposed on the outside of the multilayer circuit board. Thus, the heat resistance of the via-hole conductor during a reflow process is particularly important.

Embodiment 7

Figure 18:
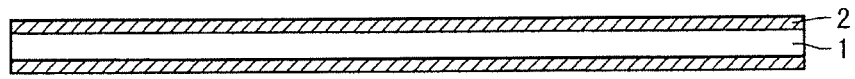
FIGS. 18(a) to 18(g) are schematic views illustrating a method for manufacturing a multilayer circuit board according to Embodiment 7.
Figure 18:
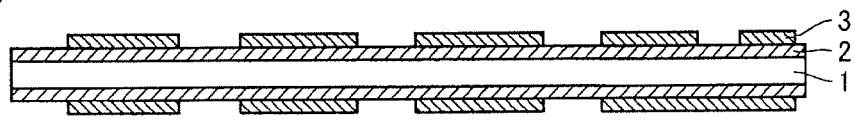
Figure 18:
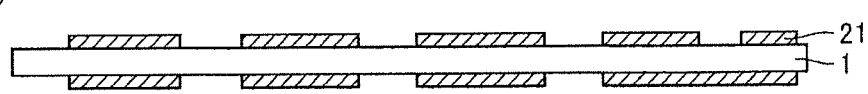
Figure 18:
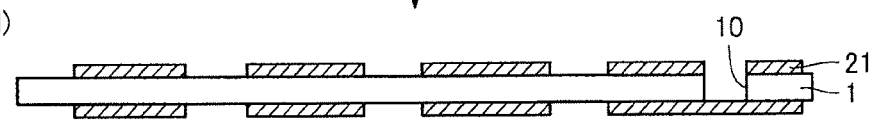
Figure 18:
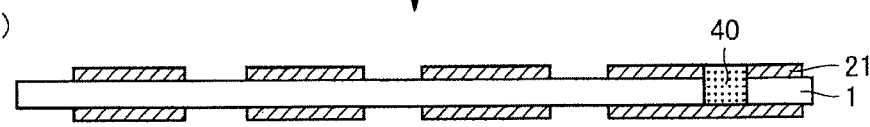
Figure 18:
Figure 18:
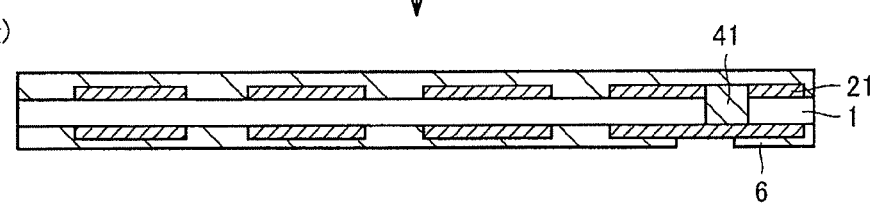
Figure 19:
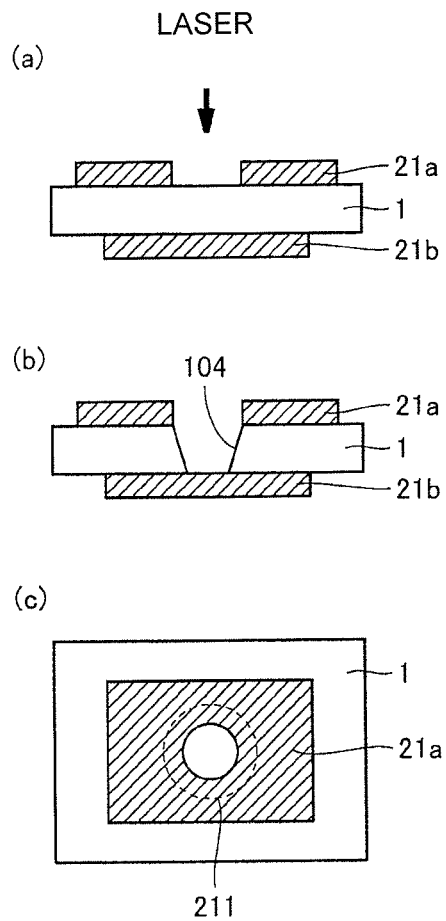
FIGS. 19(a) to 19(c) are schematic views illustrating a conformal laser processing method.

In the present embodiment, as an example of a method for manufacturing a multilayer circuit board, a method for forming the via-hole conductor in the resin sheet by using a conformal laser processing method (a conformal via processing method) will be described below with reference to. FIGS. 18 and 19.

As illustrated in FIG. 18(a), a resin sheet and conductive foils 2 on the top and bottom surfaces of the resin sheet are formed. As illustrated in FIG. 18(b), a circuit resist 3 is then formed. The conductive foils 2 are etched by using one of various known methods using the circuit resist 3 as a mask to manufacture a circuit board that includes a conductive wiring layer 21 having a desired circuit pattern on the top and bottom surfaces of the circuit board (FIG. 18(c)).

The resin sheet may be a resin sheet containing the resin described above. The resin of the resin sheet may flow during heat treatment. Thus, it is desirable that heat treatment in pressing described below be performed at a relatively low temperature. In particular, when the resin is a thermoplastic resin, which is highly likely to flow during heat treatment, it is desirable that heat treatment be performed at a relatively low temperature.

The conductive wiring layer may be formed using one of various known methods. For example, after conductive foil is bonded to a surface of the resin sheet or is placed on a surface of the resin sheet without using an adhesive (laminate), the conductive foil may be etched to form a conductive wiring layer. Alternatively, conductive foil formed into the shape of a conductive wiring layer may be transferred to the resin sheet. Alternatively, a circuit may be formed on a surface of the resin sheet by metal plating.

The material of the conductive foil for use in the formation of the conductive wiring layer may be copper, silver, aluminum, SUS, nickel, gold, or an alloy thereof, preferably copper. The conductive foil may have any thickness, provided that a circuit can be formed, and may be in the range of approximately 3 to 40 µm. The conductive foil may be roughened on its surface so as to improve its adhesion to the resin sheet. The roughness (Rz) of the rough surface may be in the range of 1 to 15 µm. The conductive foil can bite into the resin sheet, which enhances the bonding between the conductive foil and the resin sheet.

(1) Step of Forming Via-Hole Having Bottom

A via-hole 41 having a bottom is formed at a predetermined position at which the conductive wiring layer on the top is to be electrically connected to the conductive wiring layer on the bottom (FIG. 18(d)). The via-hole 41 having a bottom is formed by a conformal laser processing method, for example, using a carbon dioxide laser. According to the conformal laser processing method (the conformal via processing method), a conductive wiring layer (conductive foil) is selectively etched by photofabrication, and a via-hole having a bottom is then formed using the conductive wiring layer as a laser mask.

For example, as illustrated in FIG. 19(a), a conductive wiring layer 21a on the top is etched to form an opening at a position at which the conductive wiring layer 21a is to be connected to a conductive wiring layer on the bottom. A region 211 illustrated in FIG. 19(c) is irradiated with a laser beam through the opening in the conductive wiring layer 21a to remove part of a resin sheet corresponding to the opening. The conductive wiring layer 21b serves as a reflector for the laser beam. Thus, a via-hole 4 having a bottom is formed, as illustrated in FIG. 19(b).

If necessary, residual smears (resin residues) in the via-hole formed through laser processing are removed by oxygen plasma treatment or general-purpose chemical solution treatment.

(2) Step of Charging Electroconductive Paste

The via-hole 4 having a bottom thus formed is filled with an electroconductive paste 50 by one of various known methods, such as a screen printing method or a vacuum filling method (FIG. 18(e)). The electroconductive paste 50 can yield an intermetallic compound having a melting point of 300° C. or more by a reaction between the first metal and the second metal.

(3) Step of Forming Via-Hole Conductor

The circuit board including the electroconductive paste thus formed is heat-treated to form a via-hole conductor 51. Thus, the conductive wiring layer 21 on the top is electrically connected to the conductive wiring layer 21 on the bottom (FIG. 18(f)).

The heat treatment temperature is preferably 230° C. or more at least for a predetermined period of time. When the treatment temperature does not reach 230° C., Sn (melting point: 232° C.) in the first metal does not melt and cannot form an intermetallic compound. The maximum temperature of the heat treatment is preferably 300° C. or less. When the maximum temperature of the heat treatment exceeds 300° C., and the resin sheet contains LCP as the resin, the resin may flow out. Although the flow temperature of the resin (LCP) at a pressure of 0 Pa depends on its molecular weight, the resin starts to flow at a temperature of approximately 315° C.

In this heat treatment process, the flux component in the via paste is decomposed and volatilizes. Sn in the first metal reacts with the second metal (such as Cu—Ni or Cu—Mn) to form an intermetallic compound. At the interface between the conductive wiring layer and the electroconductive paste, a metal of the conductive wiring layer reacts with Sn in the first metal of the electroconductive paste to form an alloy layer.

In the present embodiment, the exposed surface of the conductive wiring layer 21 is covered with a solder resist (a cover layer) 6 using one of various known methods (FIG. 18(g)). However, a portion of the conductive wiring layer 21 to be connected to another component is not covered with the solder resist 6.

In the present embodiment, the via-hole formed by the conformal laser processing method is filled with the electroconductive paste having a particular composition to form the via-hole conductor for connecting the conductive wiring layers to each other. Thus, a multilayer circuit board having excellent electrical conductivity and heat resistance can be manufactured at low cost.

EXAMPLES

Although the present invention will be further described in the following examples, the present invention is not limited to these examples.

Example 1

The present example corresponds to Embodiment 1. A LCP thermoplastic resin sheet having a thickness of 50 µm was prepared. The resin sheet had a conductive foil on one surface. The conductive foil was a roughened copper foil (a copper foil having a single rough surface) having a thickness of 18 µm. The roughness (Rz) of the rough surface was 3 µm. The rough surface was bonded to the resin sheet.

The conductive foil on the resin sheet was etched by photolithography to form a conductive wiring layer.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam.

Residual smears (resin residues) formed by the laser processing in the via-hole were dissolved and removed with a permanganic acid solution.

The via-hole thus formed was filled with an electroconductive paste by screen printing. The electroconductive paste was prepared by mixing a metal component with a flux component at a weight ratio of 90% to 10%. The metal component was composed of a Sn powder having an average particle size of 5 μm and a Cu-10Ni alloy powder (the Cu/Ni weight ratio was 90/10) having an average particle size of 5 μm. The Sn powder constituted 60% by weight of the metal component, and the Cu-10Ni alloy powder constituted 40% by weight of the metal component. The flux component was composed of rosin (vehicle) and terpineol (solvent).

A plurality of resin layers having a filled via thus formed were heated to a temperature of approximately 280° C. and were press-bonded at the same time at a pressure of 4 MPa for 30 minutes. The press bonding bonded the resin sheets together and simultaneously decomposed and volatilized the solvent and the flux component in the via (electroconductive paste). The metal component Sn (the first metal) reacted with Cu-10Ni (the second metal) to yield an intermetallic compound. A metal Cu of the conductive wiring layer and the metal component Sn in the via formed an alloy layer at the interface between the conductive wiring layer and the via-hole conductor. Thus, a multilayer circuit board according to the present example was manufactured. In order to form an electrode pattern for mounting on the multilayer circuit board, a conductive wiring layer of at least one outermost resin layer is preferably inverted on the resin sheet such that the conductive wiring layer faces outward.

Although not provided in the present example, a solder resist having an opening may be disposed on the conductive wiring layer such that an electrode for surface mounting was exposed and the other portion of the conductive wiring was covered. The electrode for surface mounting may be plated.

A reaction between the first metal Sn and the second metal Cu-10Ni initially yields $Cu_2NiSn$ as an intermetallic compound. The lattice constant A of the second metal (Cu-10Ni) is 0.357 nm, and the lattice constant B of the intermetallic compound ($Cu_2NiSn$) is 0.597 nm. Thus, the ratio $[(B-A)/A \times 100]$ of the difference in lattice constant between the intermetallic compound and the second metal to the lattice constant of the second metal is 67%. These lattice constants are evaluated based on an a-axis.

The lattice constant of a Cu—Ni alloy having a Ni content in the range of 10% by weight to 15% by weight is substantially the same as the lattice constant of Cu.

In addition to $Cu_2NiSn$ initially produced on the surface of the second metal, a high-melting-point Ni—Sn intermetallic compound and a high-melting-point Cu—Sn intermetallic compound are also formed as intermetallic compounds. Because of a large difference in lattice constant between the intermetallic compound $Cu_2NiSn$ initially produced on the surface of the Cu—Ni powder and the second metal (Cu-10Ni), the intermetallic compound $Cu_2NiSn$ detaches together with the Ni-Sn intermetallic compound and the Cu—Sn intermetallic compound disposed on the intermetallic compound $Cu_2NiSn$. More specifically, a large difference in lattice constant between an intermetallic compound layer and the second metal serving as a base metal results in repeated detachment, dispersion, and reaction of the intermetallic compound in the molten first metal. This can dramatically promote the formation of the intermetallic compound and convert substantially all the low-melting-point first metal into a high-melting-point intermetallic compound.

Example 2

The present example corresponds to Embodiments 2-1 to 2-3. A LCP thermoplastic resin sheet having a thickness of 50 μm was prepared. The resin sheet had a conductive foil on one surface. The conductive foil was a roughened copper foil (a copper foil having a single rough surface) having a thickness of 18 μm. The roughness (Rz) of the rough surface was 3 μm. The rough surface was bonded to the resin sheet. The copper foil surface was roughened by the electrodeposition of Cu particles through electric field plating.

The conductive foil on the resin sheet was etched by photolithography to form a conductive wiring layer.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam. Residual smears (resin residues) formed by the laser processing in the via-hole were dissolved and removed with a permanganic acid solution.

The via-hole thus formed was filled with an electroconductive paste by screen printing. The electroconductive paste was prepared by mixing a metal component with a flux component at a weight ratio of 90% to 10%. The metal component was composed of a Sn powder having an average particle size of 5 μm and a Cu-10Ni alloy powder (the Cu/Ni weight ratio was 90/10) having an average particle size of 5 μm. The Sn powder constituted 40% by weight of the metal component, and the Cu-10Ni alloy powder constituted 60% by weight of the metal component. The flux component was composed of rosin (vehicle) and terpineol (solvent).

A plurality of resin layers having a filled via were formed in this manner. At least one resin layer was punched to form a cavity having substantially the same size as an electronic component (IC, a capacitor, or an inductor) to be mounted. A number of resin layers having the cavity corresponding to the thickness of the electronic component were prepared. The resin layers were stacked, and the electronic component was placed in the cavity with a mounting apparatus. A predetermined number of resin layers were stacked and were press-bonded at the same time at a temperature of approximately 280° C. at a pressure of 4 MPa for 30 minutes.

The press bonding bonded the resin sheets together and simultaneously decomposed and volatilized the flux component in the via (electroconductive paste). The metal component Sn (the first metal) reacted with Cu-10Ni (the second metal) to yield an intermetallic compound. A metal Cu of the conductive wiring layer and the metal component Sn in the via formed an alloy layer at the interface between the conductive wiring layer and the via-hole conductor. Thus, a via-hole conductor formed out of the electroconductive paste electrically connected conductive wiring layers to each other, and an external electrode of an electronic component was electrically connected to the via-hole conductor formed out of the electroconductive paste. Thus, a multilayer circuit board according to the present example was manufactured. In order to form an electrode pattern for mounting on the multilayer circuit board, a conductive wiring layer of at least one outermost resin layer is preferably inverted on the resin sheet such that the conductive wiring layer faces outward.

Although not provided in the present example, a solder resist may be formed on a conductive wiring layer. The solder resist may have an opening through which an electrode for surface mounting is exposed. The electrode for surface mounting may be plated.

Example 3

The present example corresponds to Embodiment 3. A LCP thermoplastic resin sheet having a thickness of 50 μm was prepared. The resin sheet had a conductive foil on one surface. The conductive foil was a roughened copper foil (a copper foil having a single rough surface) having a thickness of 18 μm. The roughness (Rz) of the rough surface was 3 μm. The rough surface was bonded to the resin sheet by thermocompression.

The conductive foil on the resin sheet was etched by photolithography to form a conductive wiring layer.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam. A via-hole for forming a connection terminal (for connecting a conductive wiring layer to an electrode of an electronic component to be placed in a multilayer circuit board) in a resin layer disposed on at least one surface of the multilayer circuit board was not in contact with conductive wiring on the surface on which the conductive wiring layer was formed. Residual smears (resin residues) formed by the laser processing in the via-hole were dissolved and removed with a permanganic acid solution.

The via-hole thus formed was filled with an electroconductive paste by screen printing. The electroconductive paste was prepared by mixing a metal component with a flux component at a weight ratio of 90% to 10%. The metal component was composed of a Sn powder having an average particle size of 5 μm and a Cu-10Ni alloy powder (the Cu/Ni weight ratio was 90/10) having an average particle size of 5 μm. The Sn powder constituted 60% by weight of the metal component, and the Cu-10Ni alloy powder constituted 40% by weight of the metal component. The flux component was composed of rosin (vehicle) and terpineol (solvent).

A plurality of resin layers having a filled via thus formed were stacked, and a predetermined number of resin layers were stacked such that a connection terminal was disposed on the surface. The resin layers were heated to a temperature of approximately 280° C. and were press-bonded at the same time at a pressure of 4 MPa for 30 minutes.

The press bonding bonded the resin sheets together and simultaneously decomposed and volatilized the flux component in the via (electroconductive paste). The metal component Sn (the first metal) reacted with Cu-10Ni (the second metal) to yield an intermetallic compound and also formed an alloy layer with a metal of the conductive wiring layer. Thus, a via-hole conductor formed out of the electroconductive paste electrically connected conductive wiring layers to each other, and a connection terminal formed out of the electroconductive paste for connecting a conductive wiring layer to an electrode of an electronic component to be mounted was also formed. The connection terminal formed out of the electroconductive paste was then plated with Ni, Au, Sn, or the like. Thus, a multilayer circuit board according to the present example was manufactured.

An electronic component was placed on a connection terminal of a multilayer circuit board thus manufactured. After a reflow process, a desired small electronic component was obtained.

Example 4

The present example corresponds to Embodiment 4. A LCP thermoplastic resin sheet having a conductive foil on one surface was prepared. The conductive foil was a roughened copper foil (a copper foil having a single rough surface) having a thickness of 18 μm. The roughness (Rz) of the rough surface was 3 μm. The rough surface was bonded to the resin sheet. The copper foil surface was roughened by the electrodeposition of Cu particles through electric field plating.

The conductive foil on the resin sheet was etched by photolithography to form a conductive wiring layer.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam. A via-hole was also formed for the formation of a thermal via (for connecting a conductive wiring layer serving as a heat radiation pattern to an electronic component to be placed in a multilayer circuit board). Residual smears (resin residues) formed by the laser processing in the via-hole were dissolved and removed with a permanganic acid solution.

The via-hole thus formed was filled with an electroconductive paste by screen printing. The electroconductive paste was prepared by mixing a metal component with a flux component at a weight ratio of 90% to 10%. The metal component was composed of a Sn powder having an arithmetic mean particle size of 5 μm and a Cu-10Ni alloy powder (the Cu/Ni weight ratio was 90/10) having an arithmetic mean particle size of 5 μm. The Sn powder constituted 60% by weight of the metal component, and the Cu-10Ni alloy powder constituted 40% by weight of the metal component. The flux component was composed of rosin (vehicle) and terpineol (solvent).

A plurality of resin layers having a filled via were formed in this manner. At least one resin layer was punched to form a cavity having substantially the same size as an electronic component (IC, a capacitor, or an inductor) to be mounted. A number of resin layers having the cavity corresponding to the thickness of the electronic component were prepared. The resin layers were stacked, and the electronic component was placed in the cavity with a mounting apparatus. A predetermined number of resin layers were stacked and were press-bonded at the same time at a temperature of approximately 280° C. at a pressure of 4 MPa for 30 minutes.

The press bonding connected the resin of each resin sheet to each other and simultaneously decomposed and volatilized the flux component in the via (electroconductive paste). The metal component Sn (the first metal) reacted with Cu-10Ni (the second metal) to yield an intermetallic compound and also formed an alloy layer with a metal of the conductive wiring layer. Thus, a via-hole conductor formed out of the electroconductive paste was formed to electrically connect conductive wiring layers to each other. A terminal electrode 23 of an electronic component was electrically connected to a via-hole conductor 42 formed out of the electroconductive paste. A via-hole conductor (thermal via) formed out of the electroconductive paste for connecting a conductive wiring layer functioning as a heat radiation pattern layer to an electronic component was formed. Thus, a multilayer circuit board according to the present example was manufactured. In order to form an electrode pattern for mounting or a heat radiation pattern layer on the multilayer circuit board, a conductive wiring layer of at least one outermost resin layer is preferably inverted on the resin sheet such that the conductive wiring layer faces outward.

Although not provided in the present example, a solder resist may be formed on a conductive wiring layer. The solder resist may have an opening through which an electrode for surface mounting is exposed. The electrode for surface mounting may be plated.

Example 5

The present example corresponds to Embodiment 5. A LCP resin sheet having a thickness of 50 μm was prepared. The resin sheet had a conductive foil on one surface. The conductive foil was a copper foil (a copper foil having a single rough surface) having a thickness of 12 μm. The roughness (Rz) of the rough surface was 3 μm. The rough surface was bonded to the resin sheet. The copper foil surface was roughened by the electrodeposition of Cu particles through electric field plating.

The conductive foil on the resin sheet was etched by photolithography to form a conductive wiring layer (a surface electrode and an internal wiring layer). No via-receiving conductor pattern was formed. The term "via-receiving conductor pattern", as used herein, refers to a component that is composed of a conductor other than the conductive wiring layer (the internal wiring layer and the surface electrode) and is used only for the connection of via-hole conductors.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam. Residual smears (resin residues) formed by the laser processing in the via-hole were dissolved and removed with a permanganic acid solution.

The via-hole thus formed was filled with an electroconductive paste by screen printing. The filling was performed while the resin sheet was placed on a support. Thus, a via-hole having no conductive wiring layer on either surface can be filled with the electroconductive paste.

The electroconductive paste was prepared by mixing a metal component with a flux component at a weight ratio of 90% to 10%. The metal component was composed of a Sn powder having an average particle size of 5 μm and a Cu-10Ni alloy powder (the Cu/Ni weight ratio was 90/10) having an average particle size of 5 μm. The Sn powder constituted 60% by weight of the metal component, and the Cu-10Ni alloy powder constituted 40% by weight of the metal component. The flux component was composed of rosin (vehicle) and terpineol (solvent).

A plurality of resin layers having a filled via were formed in this manner. A predetermined number of resin layers having a filled via were heated to a temperature of approximately 280° C. and were press-bonded at the same time at a pressure of 4 MPa for 30 minutes.

The press bonding bonded the resin sheets together and simultaneously decomposed and volatilized the flux component in the via (electroconductive paste). The metal component Sn (the first metal) reacted with Cu-10Ni (the second metal) to yield an intermetallic compound. A metal Cu of the conductive wiring layer and the metal component Sn in the via formed an alloy layer at the interface between the conductive wiring layer and the via-hole conductor. A via-hole conductor formed out of the electroconductive paste was formed to electrically connect conductive wiring layers to each other. Thus, a multilayer circuit board according to the present example was manufactured.

Example 6

The present example corresponds to Embodiment 6. A LCP resin sheet having a thickness of 50 μm was prepared. The resin sheet had a conductive foil on one surface. The conductive foil was a copper foil (a copper foil having a single rough surface) having a thickness of 12 μm. The roughness (Rz) of the rough surface was 3 μm. The rough surface was bonded to the resin sheet. The copper foil surface was roughened by the electrodeposition of Cu particles through electric field plating.

The conductive foil on the resin sheet was etched by photolithography to form a conductive wiring layer. The conductive wiring layer was disposed on a cross-section at which a multilayer composite board including resin sheets was to be cut.

An opening (via-hole) was bored in a resin layer including the conductive wiring layer at a predetermined position (a portion for via formation) by irradiating a surface of the resin layer opposite the surface on which the conductive wiring layer was disposed with a carbon dioxide laser beam. The via-hole was formed on a cross-section at which the multilayer composite board was to be divided into multilayer circuit boards. This can increase the wiring area in the multilayer circuit board. Residual smears (resin residues) formed by the laser processing in the via-hole were dissolved and removed with a permanganic acid solution. The via-hole can be cut simultaneously with cutting of the multilayer composite board composed of the resin layers.

The via-hole thus formed was filled with an electroconductive paste by screen printing.

The electroconductive paste was prepared by mixing a metal component with a flux component at a weight ratio of 90% to 10%. The metal component was composed of a Sn powder having an average particle size of 5 μm and a Cu-10Ni alloy powder (the Cu/Ni weight ratio was 90/10) having an average particle size of 5 μm. The Sn powder constituted 60% by weight of the metal component, and the Cu-10Ni alloy powder constituted 40% by weight of the metal component. The flux component was composed of rosin (vehicle) and terpineol (solvent).

A plurality of resin layers having a filled via were formed in this manner. A predetermined number of resin layers having a filled via were heated to a temperature of approximately 280° C. and were press-bonded at the same time at a pressure of 4 MPa for 30 minutes.

The press bonding bonded the resin sheets together and simultaneously decomposed and volatilized the flux component in the via (electroconductive paste). The metal component Sn (the first metal) reacted with Cu-10Ni (the second metal) to yield an intermetallic compound. A metal Cu of the conductive wiring layer and the metal component Sn in the via formed an alloy layer at the interface between the conductive wiring layer and the via-hole conductor. Thus, a multilayer circuit board according to the present example was manufactured in which a via-hole conductor formed out of the electroconductive paste electrically connected conductive wiring layers to each other.

The multilayer composite board was cut with a lever shear into multilayer circuit boards according to the present example. An external electrode formed by cutting the via-hole conductor was disposed on the side surfaces of the multilayer circuit boards. The external electrodes may be plated with a metal, such as Ni/Au or Ni/Pd/Au. An external electrode having a plating film can have greater soldering reliability than the external electrode before plating.

A reaction between the first metal Sn and the second metal Cu-10Ni yields $Cu_2NiSn$ as an intermetallic compound. The lattice constant A of the second metal (Cu-10Ni) is 0.357 nm, and the lattice constant B of the intermetallic compound ($Cu_2NiSn$) is 0.597 nm. Thus, the ratio $[(B-A)/A \times 100]$ of the difference in lattice constant between the intermetallic compound and the second metal to the lattice constant of the second metal is 67%. These lattice constants are evaluated based on an a-axis.

The lattice constant of a Cu—Ni alloy having a Ni content in the range of 10% by weight to 15% by weight is substantially the same as the lattice constant of Cu.

In addition to $Cu_2NiSn$, a high-melting-point Ni-Sn intermetallic compound and a high-melting-point Cu—Sn intermetallic compound are also formed as intermetallic compounds. Because of a large difference in lattice constant between the intermetallic compound $Cu_2NiSn$ initially produced on the surface of the Cu—Ni powder and the second metal (Cu-10Ni), the intermetallic compound $Cu_2NiSn$ detaches together with the Ni-Sn intermetallic compound and the Cu—Sn intermetallic compound disposed on the intermetallic compound $Cu_2NiSn$. More specifically, a large difference in lattice constant between an intermetallic compound layer and the second metal serving as a base metal results in repeated detachment, dispersion, and reaction of the intermetallic compound in the molten first metal. This can dramatically promote the formation of the intermetallic compound and convert substantially all the low-melting-point first metal into a high-melting-point intermetallic compound.

Test Example 1-1

A cylindrical via-hole having a diameter of 100 μm was formed in a LCP resin sheet having a thickness of 25 μm provided with a copper foil having a thickness of 12 μm. After the via-hole was filled with an electroconductive paste, heat treatment was performed under the same conditions as one-time press bonding described in Example 1 to form a via-hole conductor. The electroconductive paste was the same as the electroconductive paste used in Example 1 except that the blend ratios (% by weight) and the average particle sizes of the first metal and the second metal were changed as shown in Table 1. These electroconductive pastes were referred to as samples A1 to A8. The following characteristics of the samples A1 to A8 were evaluated.

Electrical Conductivity

The resistance of a cylindrical via-hole conductor was measured. The cylindrical via-hole conductor had a diameter of 100 μm and was disposed in a resin sheet having a thickness of 25 μm provided with a copper foil having a thickness of 12 μm. In Table 1, a resistance of 10 mΩ or less was rated as "good", and a resistance of more than 10 mΩ was rated as "poor".

Reflow Resistance

The remelting of a via-hole conductor was observed in reheating (reflow) at a temperature of 260° C. in a $N_2$ atmosphere for 30 seconds. The electrical conductivity of the via-hole conductor after reflow was also evaluated. In Table 1, high electrical conductivity (the resistance change was 20% or less) without deformation of the via-hole conductor due to remelting was rated as "good", and the others were rated as "poor".

Heat Shock Resistance (H/S)

A 1000-cycle heat shock durability test at −55° C./+125° C. was performed to measure the variation in the resistance of a via-hole conductor caused by the durability test. In Table 1, a variation of 20% or less was rated as "good", and a variation of more than 20% was rated as "poor".

TABLE 1

| | First metal (Sn) | | Second metal (Cu—10Ni) | | | | |
|---|---|---|---|---|---|---|---|
| | Average particle size (μm) | Ratio (% by weight) | Average particle size (μm) | Ratio (% by weight) | Electrical conductivity | Reflow resistance | H/S |
| Sample A1 | 5 | 60 | 5 | 40 | good | good | good |
| Sample A2 | 5 | 70 | 5 | 30 | good | good | good |
| Sample A3 | 5 | 50 | 5 | 50 | good | good | good |
| Sample A4 | 5 | 80 | 5 | 20 | good | good | good |
| Sample A5 | 3 | 60 | 3 | 40 | good | good | good |
| Sample A6 | 10 | 60 | 10 | 40 | good | good | good |
| Sample A7 | 15 | 60 | 15 | 40 | good | good | good |
| Sample A8 | 5 | 60 | 10 | 40 | good | good | good |

The results for the samples A1 to A in Table 1 show that when the second metal content of the metal component is 20% by weight or more, the via-hole conductor has good characteristics (electrical conductivity, reflow resistance, and heat shock resistance). When the blend ratios (% by weight) and the average particle sizes of the first metal and the second metal are changed as in the samples A5 to A8 or are different as in the sample A8, the via-hole conductor also has excellent characteristics.

The reason for the excellent characteristics (electrical conductivity, reflow resistance, and heat shock resistance) of the via-hole conductor in the samples A1 to A8 is probably that use of a Cu—Ni alloy as the second metal results in the initial formation of $Cu_2NiSn$ as an intermetallic compound on the surface of the second metal, and the difference in lattice constant between the intermetallic compound and the second metal is 50% or more. More specifically, a large difference in lattice constant between an intermetallic compound layer and the second metal serving as a base metal results in repeated detachment, dispersion, and reaction of the intermetallic compound in the molten first metal. This can dramatically promote the formation of the intermetallic compound and convert substantially all the low-melting-point first metal, such as Sn, into a high-melting-point intermetallic compound.

Test Example 1-2

A via-hole conductor was formed in the same manner as in the sample A1 except that the first metal component and the second metal component were changed as shown in Table 2. They were referred to as samples B1 to B5 and comparative samples B1 and B2. The characteristics of the samples B1 to B5 and the comparative samples B1 and B2 were evaluated in the same manner as in Test Example 1-1. Table 2 shows the results. The samples B1 to B5 had good electrical conductivity, reflow resistance, and heat shock resistance, whereas the comparative samples 1 and 2 had poor reflow resistance and heat shock resistance. In the comparative sample 1, the second component was Cu alone, and the intermetallic compound was $Cu_3Sn$. This resulted in a difference as small as approximately 20% in lattice constant between the intermetallic compound and the second metal. This probably resulted in inefficient formation of the intermetallic compound and poor heat resistance. The comparative sample 2 had poor reflow resistance and heat shock resistance. This is because the first metal is not a metal (alloy) containing 70% by weight or more Sn, and the intermetallic compound (layer) initially formed at the interface is $Cu_3Sn$. Like the comparative sample 1, this probably results in inefficient formation of the intermetallic compound and poor heat resistance.

TABLE 2

|  | First metal (60 wt %) (Average particle size 5 μm) | Second metal (40 wt %) (Average particle size 5 μm) | Electrical conductivity | Reflow resistance | H/S |
| --- | --- | --- | --- | --- | --- |
| Sample B1 | Sn | Cu—15Ni | good | good | good |
| Sample B2 | Sn | Cu—10Mn | good | good | good |
| Sample B3 | Sn—0.75Cu | Cu—10Ni | good | good | good |
| Sample B4 | Sn—3Ag—0.5Cu | Cu—10Ni | good | good | good |
| Sample B5 | Sn—30Bi | Cu—10Mn | good | good | good |
| Comparative sample B1 | Sn—3Ag—0.5Cu | Cu | good | poor | poor |
| Comparative sample B2 | Sn—40Bi | Cu—10Mn | good | poor | poor |

Test Example 2

A multilayer circuit board was manufactured in the same manner as in the sample A1 except that the thermocompression bonding temperature of resin layers stacked using the electroconductive paste used in the sample A1 was 280° C., 300° C., or 315° C. The resin flowed at 315° C. but did not flow at 280° C. or 300° C. This is probably because in the present test example, a via-hole conductor 3 mainly composed of an intermetallic compound having a melting point of 300° C. or more was formed at a temperature lower than the softening temperature of the resin and prevented the resin of the resin layer 1 from flowing out even if the resin is softened.

As a comparative example, a multilayer circuit board was manufactured in the same manner as in Example 1 except that the thermocompression bonding temperature of resin layers stacked using a low-temperature-bonding electroconductive paste composed of Sn/Ag/Bi/Cu and a resin component was 280° C., 300° C., or 315° C. The resin did not flow at 280° C. but flowed at 300° C. or 315° C. This is probably because the via-hole conductor was not mainly composed of an intermetallic compound having a melting point of 300° C. or more and contained low-melting-point Sn, Bi, and its alloy (Sn—Bi). Thus, the via-hole conductor formed a liquid phase at the softening temperature of the resin, and therefore the flow of the resin could not be prevented.

The via-hole conductor in the multilayer circuit board according to the comparative example had good electrical conductivity but poor reflow resistance and heat shock resistance (H/S). This probably results from a physicality difference between a via-hole conductor according to an embodiment and a via-hole conductor according to a comparative example. In the via-hole conductor according to an embodiment, substantially all the flux component volatilized, and no organic component remained. In contrast, the via-hole conductor according to a comparative example contained an epoxy resin component.

Test Example 3

Figure 20:
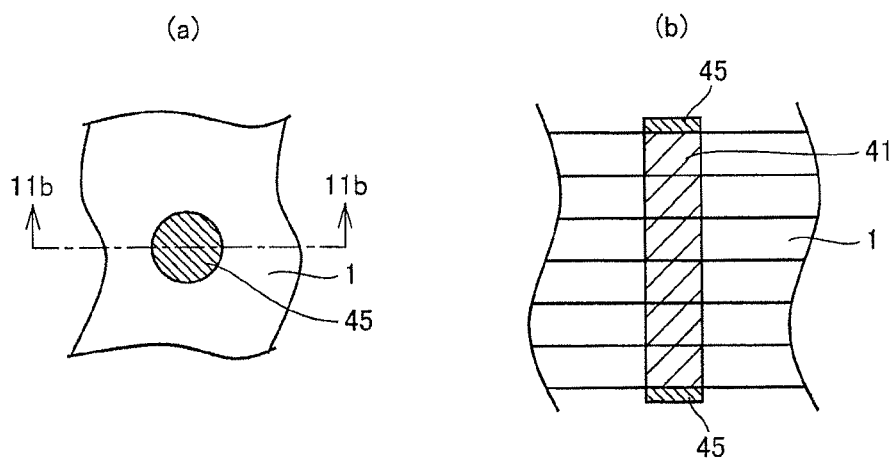
FIG. 20(a) is a top view of a structure of a multilayer circuit board of samples B1 to B6 according to Test Example 1-2.
FIG. 20(b) is a cross-sectional view of the structure of the multilayer circuit board of the samples B1 to B6.

The present invention can ensure connection reliability of even a small multilayer circuit board having a high mounting density. This will be described below with reference to FIGS. 20 to 22. FIG. 20(b) is a cross-sectional view taken along the line 12b-12b of FIG. 20(a), and FIG. 21(b) is a cross-sectional view taken along the line 12b-12b of FIG. 21(a).

In the same manner as in Example 3, multilayer circuit boards (samples C1 to C6) having a structure illustrated in FIG. 20 were manufactured. Each of the multilayer circuit boards included LCP resin layers each including a conductive wiring layer and connection terminals (internal terminals) formed out of a via-hole conductor 41 and having no land electrode (conductive wiring layer). The connection terminals were covered with metal plating 45. Table 3 listed the via diameters and the via pitches of the samples C1 to C6.

Figure 21:
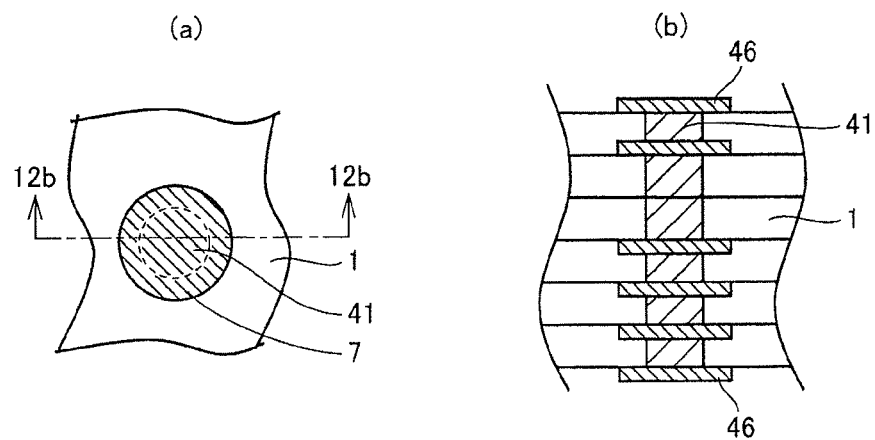
FIG. 21(a) is a top view of a structure of a multilayer circuit board of comparative samples B1 to B6 according to Test Example 1-2.
FIG. 21(b) is a cross-sectional view of the structure of the multilayer circuit board of the comparative samples B1 to B6.
Figure 22:
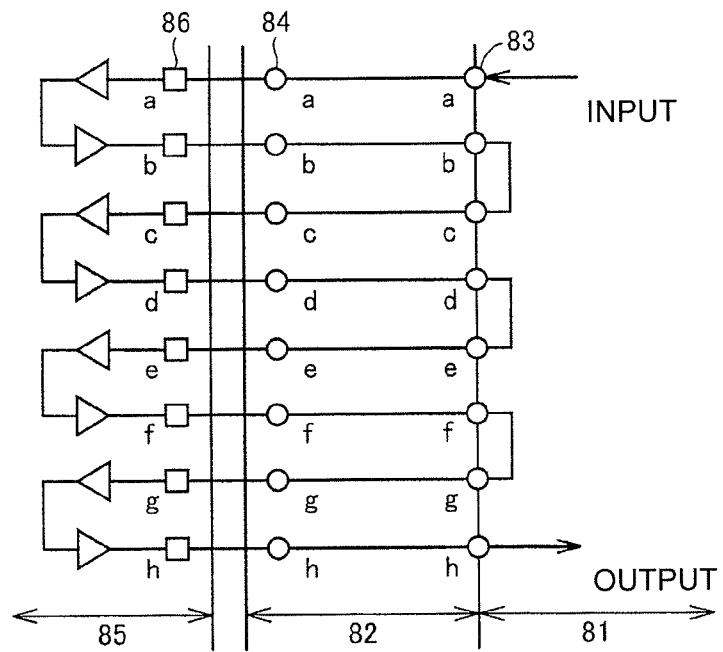
FIG. 22 is a diagram illustrating a method for evaluating a multilayer circuit board according to Test Example 1-2.

For comparison purposes, multilayer circuit boards (comparative samples C1 to C6) having a structure illustrated in FIG. 21 manufactured in the same manner as in Example 3 except that the connection terminals (internal terminals) were formed out of a via-hole conductor 41 having a land electrode 46. Table 3 listed the land diameters, the via diameters, and the via pitches of the comparative samples C1 to C6. An IC having solder balls (daisy-chain IC) having the same terminal diameter (via diameter) and the terminal pitch as in the sample (multilayer circuit board) was mounted on the samples C1 to C6 and the comparative samples C1 to C6 using solder (Sn-3Ag-0.5Cu). The following characteristics were evaluated using the method illustrated in FIG. 22.

More specifically, the following characteristics were evaluated using a multilayer circuit board module, which included a daisy-chain IC chip 85 and a multilayer circuit board 82, and a printed circuit board 81. The daisy-chain IC chip 85 folded back an input signal through a pair of adjacent terminals 86. The multilayer circuit board 82 included a multilayer circuit board internal terminal 84 and a multilayer circuit board external terminal 83 connected to the terminals 86 of the chip 85. The printed circuit board 81 included a pair of adjacent multilayer circuit board external terminals 83. The terminals other than the two external terminals were daisy-chained together. The following characteristics were measured between the two external terminals. Table 3 shows the results.

Bonding Reliability

After the reflow test at a temperature of 260° C. in a $N_2$ atmosphere for 30 seconds was performed three times, a temperature cycling test of 5000 cycles was performed at −55° C./+125° C. The resistance of each chain (12 via-hole conductors) was measured before and after the test. In Table 3, a resistance change of 20% or less without open (no continuity) was rated as "good", and open or a resistance change more than 20% was rated as "poor".

TABLE 3

| | Land diameter (μm) | Via diameter (μm) | Via pitch (μm) | Formability | Bonding reliability |
|---|---|---|---|---|---|
| Sample C1 | — | 200 | 300 | good | good |
| Sample C2 | — | 200 | 250 | good | good |
| Sample C3 | — | 100 | 175 | good | good |
| Sample C4 | — | 100 | 150 | good | good |
| Sample C5 | — | 75 | 125 | good | good |
| Sample C6 | — | 75 | 100 | poor | — |
| Comparative sample C1 | 300 | 200 | 400 | good | good |
| Comparative sample C2 | 300 | 200 | 325 | poor | — |
| Comparative sample C3 | 150 | 100 | 225 | good | good |
| Comparative sample C4 | 150 | 100 | 175 | poor | — |
| Comparative sample C5 | 125 | 75 | 175 | good | poor |
| Comparative sample C6 | 125 | 75 | 150 | poor | — |

The results in Table 3 show that the present invention can provide a smaller multilayer circuit board having a higher mounting density than the comparative examples and that the multilayer circuit board has sufficient bonding reliability even when the via pitch is decreased to 125 μm. A connection terminal formed out of a via-hole conductor for use in the present invention is difficult to melt even with heat, for example, in second or more reflow and can be connected to an IC on a surface of a multilayer circuit board without using a land. Such a connection terminal contributes to a smaller multilayer circuit board having a higher mounting density resulting from finer pitches.

Test Example 4

Samples D1 to D4 were manufactured in the same manner as in the sample 1 except that the roughness (Rz) of a rough surface of copper foil was in the range of 2 to 3 μm and that the via diameter and the via height were changed as listed in Table 4. For comparison purposes, a comparative sample D1 was manufactured in the same manner as in the sample D1 except that the surface roughness (Rz) of copper foil was 0.2 μm or less. The resistance of the samples D1 to D4 and the comparative sample D1 was measured. Table 4 shows the results.

TABLE 4

| | Rz (μm) | Via diameter (μm) | Via height (μm) | Resistance (mΩ) |
|---|---|---|---|---|
| Sample D1 | 2-3 | 200 | 50 | 3-4 (average 3.5) |
| Sample D2 | 2-3 | 200 | 25 | 2-3 (average 2.5) |
| Sample D3 | 2-3 | 100 | 50 | 10-15 (average 12.5) |
| Sample D4 | 2-3 | 100 | 25 | 6-8 (average 7) |
| Comparative Sample D1 | less than 0.2 | 100 | 25 | 7-9 (average 8) |

Table 4 shows that use of copper foil having a smaller surface roughness (Rz) in the via-hole conductor of the comparative sample D1 increases resistance by 20% (approximately 1 mΩ).

Thus, when an electroconductive paste for use in the present invention is used for a via-hole conductor, a rough surface of a conductive wiring layer in contact with the via-hole conductor can increase electrical conductivity (decrease resistance) at the interface between the conductive wiring layer and the via-hole conductor. Because of a rough surface of a conductive wiring layer in contact with a via-hole conductor, use of a known electroconductive paste tends to result in insufficient bonding and an increased resistance at the interface.

Test Example 5

A sample E1 including resin layers having a via-hole conductor was manufactured in the same manner as in Test Example 1 except that the resin layers were bonded together in heat treatment under normal pressure instead of thermocompression bonding of the resin layers. For comparison purposes, a comparative sample E1 including resin layers having a via-hole conductor was manufactured in the same manner in heat treatment under normal pressure using a known low-temperature-bonding electroconductive paste composed of Sn/Ag/Bi/Cu and a resin component. The characteristics of the sample E1 and the comparative sample E1 were evaluated in the same manner as in Test Example 1. Table 5 shows the results.

TABLE 5

| | Electrical conductivity | Reflow resistance | H/S |
|---|---|---|---|
| Sample E1 | good | good | good |
| Comparative Sample E1 | poor | poor | poor |

The results in Table 5 show that a via-hole conductor having sufficient electrical conductivity and H/S cannot be formed in heat treatment under normal pressure using a known electroconductive paste. In contrast, a via-hole conductor having good electrical conductivity and H/S can be formed in heat treatment under normal pressure using an electroconductive paste for use in the present invention. Thus, a multilayer circuit board having excellent connection reliability can be manufactured even in heat treatment under normal pressure. Although the characteristics of a via-hole conductor in a single resin layer were examined in the present test example, a multilayer circuit board according to an embodiment of the present invention can have substantially the same characteristics because the via-hole conductor was formed out of the electroconductive paste under normal pressure. The term "under normal pressure", as used herein, refers to a pressing pressure of 0 except the weight of the press plate (0.2 MPa).

In a multilayer circuit board according to an embodiment of the present invention, the deformation of the resin sheets of the multilayer circuit board, misalignment of conductive wiring layers with a resin sheet interposed therebetween, and misalignment of adjacent via-hole conductors in the stacking direction can be reduced under normal pressure. This can decrease variations in a parasitic impedance component of a multilayer circuit board. Thus, a multilayer circuit board or a module having decreased variations in high-frequency characteristics can be provided. An electroconductive paste for use in the present invention can be suitably used in the manufacture of a multilayer circuit board in heat treatment under normal pressure. Heat treatment under normal pressure does not necessarily require a via-receiving pattern. Thus, a multilayer circuit board having good high-frequency characteristics can be provided.

It is to be understood that the embodiments and examples described above are illustrated by way of example and not by way of limitation in all respects. The scope of the present invention is defined by the appended claims rather than by the description preceding them. All changes that fall within the scope of the claims and the equivalents thereof are therefore intended to be embraced by the claims.

REFERENCE SIGNS LIST 1, 1A, 1B, 1C, and 1D RESIN LAYER
1a and 1b SURFACE
10, 101, 102, and 103 VIA-HOLE
104 VIA-HOLE HAVING BOTTOM
11 CAVITY
2 CONDUCTIVE FOIL
21 CONDUCTIVE WIRING LAYER (SURFACE ELECTRODE)
21a and 21b CONDUCTIVE WIRING LAYER
211 IRRADIATION REGION
22 CONDUCTIVE WIRING LAYER (INTERNAL WIRING LAYER)
22a PROJECTION
3 MASK
40, 401, 402, and 403 ELECTROCONDUCTIVE PASTE
401 FIRST METAL
402 SECOND METAL
403 INTERMETALLIC COMPOUND
41, 411, 412, and 413 VIA-HOLE CONDUCTOR
42 VIA-HOLE CONDUCTOR (THERMAL VIA)
43 EXTERNAL ELECTRODE
44 CONNECTION TERMINAL
45 (METAL) PLATING
46 LAND ELECTRODE
5 ELECTRONIC COMPONENT
51 EXTERNAL ELECTRODE
52 ELECTRODE
6 SOLDER RESIST
700 SUPPORT
701 BASE
701a SURFACE
71 SPACER
76 and 77 PRESS PLATE
78 OIL FLOW PATH
81 PRINTED CIRCUIT BOARD
82 MULTILAYER CIRCUIT BOARD
83 MULTILAYER CIRCUIT BOARD EXTERNAL TERMINAL
84 MULTILAYER CIRCUIT BOARD INTERNAL TERMINAL
85 DAISY-CHAIN IC CHIP
86 TERMINAL
91 LOW-MELTING-POINT METAL BALL
92 HIGH-MELTING-POINT METAL BALL
93 INTERMETALLIC COMPOUND
1001 INSULATING FILM
1002 WIRING CONDUCTOR
1003 THROUGH CONDUCTOR
1004 MULTILAYER CIRCUIT BOARD
1005 DEPRESSED PORTION
1008 ELECTRONIC COMPONENT
1009 CONNECTION TERMINAL
1010 UNDERFILL MATERIAL
1011 CONDUCTIVE BUMP

The invention claimed is:

1. A multilayer circuit board, comprising:
a plurality of resin layers stacked on one another, each of the resin layers including a resin sheet with at least one via-hole conductor and a conductive wiring layer disposed on at least one surface of the resin sheet,
wherein each of the via-hole conductors contains an intermetallic compound comprising a reaction product between a first metal and a second metal, and
wherein the first metal is selected from the group consisting of Sn and an alloy containing at least 70% by weight of Sn, and the second metal is selected from the group consisting of a Cu—Ni alloy and a Cu—Mn alloy, the second metal having a higher melting point than the first metal.

2. The multilayer circuit board according to claim 1, wherein the intermetallic compound has a melting point of at least 300° C.

3. The multilayer circuit board according to claim 1, wherein the resin sheet comprises a thermoplastic resin.

4. The multilayer circuit board according to claim 1, wherein the second metal constitutes at least 30% by weight of the reaction product.

5. The multilayer circuit board according to claim 1, wherein Ni constitutes 10% to 15% by weight of the Cu—Ni alloy, and Mn constitutes 10% to 15% by weight of the Cu—Mn alloy.

6. The multilayer circuit board according to claim 1, wherein each of the via-hole conductors is configured to electrically connect the conductive wiring layer of the respective resin layer to a conductive wiring layer of an adjacent resin layer.

7. The multilayer circuit board according to claim 6, further comprising:
a cavity and an electronic component disposed in the cavity,
wherein at least a portion of the conductive wiring layers are configured to radiate heat generated by the electronic component, and
wherein at least a portion of the via-hole conductors function as thermal vias.

8. The multilayer circuit board according to claim 6, wherein
at least part of each of the via-hole conductors are directly connected to via-hole conductors in adjacent resin sheets without being through a via-receiving conductor pattern.

9. The multilayer circuit board according to claim 6, further comprising an electronic component having an external electrode.

10. The multilayer circuit board according to claim 9, wherein a surface of the external electrode contains Sn.

11. The multilayer circuit board according to claim 9, further comprising a plurality of connection terminals disposed on at least one surface of the multilayer circuit board for connecting the conductive wiring layers to the external electrode of the electronic component.

12. The multilayer circuit board according to claim 11, wherein the connection terminals contain the intermetallic compound.

13. The multilayer circuit board according to claim 1, wherein
the resin sheet of each of the plurality of resin layers further includes a protective via-hole conductor electrically insulated from the conductive wiring layers, and
the protective via-hole conductor contains the intermetallic compound.

14. The multilayer circuit board according to claim 1, wherein surfaces of the conductive wiring layers in contact with respective via-hole conductors are at least partly roughened.

15. The multilayer circuit board according to claim 1, wherein
the multilayer circuit board is manufactured by cutting a multilayer composite board comprising the plurality of resin layers,
the multilayer composite board includes via-hole conductors electrically connected to the conductive wiring layers, respectively, such that the via-hole conductors can be cut simultaneously with the cutting of the multilayer composite board, and
an external electrode formed by cutting the multilayer composite board is disposed on the cross-section of the multilayer circuit board.

16. A method for manufacturing a multilayer circuit board, comprising:
providing a plurality of resin layers, each resin layer having a resin sheet and a conductive wiring layer disposed on at least one surface of the resin sheet;
forming a via-hole at a predetermined position in each of the resin sheets of the plurality of resin layers;
forming an electroconductive paste containing a metal component and a flux component, the metal component containing a first metal powder being selected from the group consisting of Sn and an alloy containing at least 70% by weight of Sn, the second metal powder selected from the group consisting of a Cu—Ni alloy and a Cu—Mn alloy, and the second metal powder having a higher melting point than the first metal;
filling each of the via-holes with the electroconductive paste;
stacking the plurality of resin layers including the electroconductive paste; and
press-bonding the plurality of resin layers in a heat treatment to form via-hole conductors that electrically connect the conductive wiring layers of each resin layer to conductive wiring layers of adjacent resin layers, respectively.

17. The method for manufacturing a multilayer circuit board according to claim 16, further comprising roughing at least a portion of each of the conductive wiring layers that is in contact with the respective via-hole conductors.

18. The method for manufacturing a multilayer circuit board according to claim 16, wherein the step of forming via-holes in each of the resin sheets comprises using a carbon dioxide laser to form the via-holes.

19. The method for manufacturing a multilayer circuit board according to claim 16, further comprising:
forming a cavity in the multilayer circuit board; and
positioning an electronic component having an external electrode in the cavity.

20. The method for manufacturing a multilayer circuit board according to claim 19, further comprising thermocompression bonding the multilayer circuit board to electrically connect the external electrode of the electronic component to at least a portion of one or more conductive wiring layers.

* * * * *